United States Patent [19]
Krueger et al.

[11] Patent Number: 6,109,880
[45] Date of Patent: Aug. 29, 2000

[54] GETTER PUMP MODULE AND SYSTEM INCLUDING FOCUS SHIELDS

[75] Inventors: Gordon Krueger, Nipomo; D'Arcy Lorimer, Pismo Beach; Sergio Carella, Avila Beach, all of Calif.; Andrea Conte, Milan, Italy

[73] Assignee: SAES Pure Gas, Inc., San Luis Obispo, Calif.

[21] Appl. No.: 08/997,974

[22] Filed: Dec. 24, 1997

Related U.S. Application Data

[63] Continuation-in-part of application No. 08/332,564, Oct. 31, 1994, which is a continuation-in-part of application No. 08/348,798, Dec. 2, 1994, which is a continuation-in-part of application No. 08/521,943, Sep. 1, 1995, which is a continuation-in-part of application No. 08/826,866, Apr. 11, 1997.

[51] Int. Cl.[7] ..................................................... F04B 37/02
[52] U.S. Cl. ............................................. 417/48; 417/51
[58] Field of Search ........................................ 417/48, 51

[56] References Cited

U.S. PATENT DOCUMENTS

| | | |
|---|---|---|
| 2,965,218 | 12/1960 | Jayne . |
| 3,203,901 | 8/1965 | della Porta . |
| 3,316,386 | 4/1967 | Yaffe et al. .............................. 219/272 |
| 3,603,704 | 9/1971 | Zucchinelli ................................ 417/51 |
| 3,662,522 | 5/1972 | della Porta et al. . |

(List continued on next page.)

FOREIGN PATENT DOCUMENTS

| | | |
|---|---|---|
| 0 144 522 A2 | 6/1985 | European Pat. Off. . |
| 0 246 158 A1 | 11/1987 | European Pat. Off. . |
| 0 693 626 A1 | 1/1996 | European Pat. Off. . |
| 2 370 357 | 6/1978 | France . |
| 2 511 709 | 8/1981 | France . |

(List continued on next page.)

OTHER PUBLICATIONS

Ferrario et al., "New Types of Volume Gettering Panels for Vacuum Problems in Plasma Machines," *Proceedings of the 7th International Vacuum Congress & 3rd International Conference on Solid Surfaces*, Vienna, 1977, pp. 359–362.

Cecchi, J.L., "Impurity Control in TFTR," *Journal of Nuclear Materials*, vols. 93 & 94, 1980, pp. 28–43.

Ferrario, B., "Non–evaporable Getters in Plasma and Particle Physics Experiments," SAES Getters S.p.A., Bombay, India, 1983, pp. 175–188.

"System Grows Complex Single Crystal Materials," *Solid State Technology*, vol. 26, No. 7, Jul. 1983, pp. 39–40.

Giorgi, T. et al., "An Updated Review of Getters and Gettering," *Journal of Vacuum Science and Technology A*, vol. 3, No. 2, Mar./Apr. 1985, pp. 417–423.

(List continued on next page.)

*Primary Examiner*—Timothy S. Thorpe
*Assistant Examiner*—Cheryl J. Tyler
*Attorney, Agent, or Firm*—Hickman Stephens Coleman & Hughes, LLP

[57] ABSTRACT

An improved getter pump module includes a number of getter elements and a heating element that heats the getter elements. The getter elements are preferably porous, sintered getter disks. The heating element is disposed proximate to the getter elements and provides heat to activate the getter material and cause it to pump desired gasses. The getter elements and heater element are partially surrounded by a focus shield that is positioned between the getter elements and a wall of a processing chamber that encloses the getter elements, the heater element, and the focus shield. The focus shield is provided to reflect thermal energy to the getter material from the heater element, to provide high pumping speeds or short activation/baking times, and to reduce the heat seen by the chamber from the heating element. In certain embodiments of the present invention the focus shield is angled as to be wedge shaped, and may include planar extension portions. Multiple focus shields are provided in some embodiments.

27 Claims, 15 Drawing Sheets

U.S. PATENT DOCUMENTS

| | | |
|---|---|---|
| 3,780,501 | 12/1973 | della Porta et al. . |
| 3,820,919 | 6/1974 | Katz . |
| 3,892,650 | 7/1975 | Cuomo et al. . |
| 3,926,832 | 12/1975 | Barosi . |
| 3,961,897 | 6/1976 | Giorgi et al. .............................. 417/51 |
| 4,062,319 | 12/1977 | Roth et al. . |
| 4,071,335 | 1/1978 | Barosi . |
| 4,137,012 | 1/1979 | della Porta et al. . |
| 4,181,161 | 1/1980 | Kraus . |
| 4,269,624 | 5/1981 | Figini . |
| 4,306,515 | 12/1981 | Winkler . |
| 4,306,887 | 12/1981 | Barosi et al. . |
| 4,312,669 | 1/1982 | Boffito et al. . |
| 4,405,487 | 9/1983 | Harrah et al. . |
| 4,428,856 | 1/1984 | Boyarina et al. . |
| 4,449,373 | 5/1984 | Peterson et al. . |
| 4,460,673 | 7/1984 | Sukigara et al. . |
| 4,515,528 | 5/1985 | Young . |
| 4,571,158 | 2/1986 | Maegdefessel ............................ 417/51 |
| 4,704,301 | 11/1987 | Bauer et al. . |
| 4,907,948 | 3/1990 | Barosi et al. . |
| 5,015,226 | 5/1991 | Polaschegg . |
| 5,221,190 | 6/1993 | Romer et al. . |
| 5,238,469 | 8/1993 | Briesacher et al. . |
| 5,242,559 | 9/1993 | Giorgi . |
| 5,254,096 | 10/1993 | Rondelet et al. . |
| 5,320,496 | 6/1994 | Manini et al. . |
| 5,340,460 | 8/1994 | Kobayashi et al. . |
| 5,357,760 | 10/1994 | Higham . |
| 5,772,404 | 6/1998 | Carella et al. ............................ 417/51 |

FOREIGN PATENT DOCUMENTS

| | | |
|---|---|---|
| 1 011 996 | 7/1957 | Germany . |
| 22 04 714 | 10/1979 | Germany . |
| 41 10 588 A1 | 10/1992 | Germany . |
| 58-117372 | 7/1983 | Japan . |
| 60-222572A | 11/1985 | Japan . |
| 62-113876A | 5/1987 | Japan . |
| 4-5480 | 4/1990 | Japan . |
| 3-189380 | 8/1991 | Japan . |
| 5099538 | 4/1993 | Japan . |
| 6-117019 | 12/1995 | Japan . |
| 1168263 | 10/1969 | United Kingdom . |
| 1 329 628 | 9/1973 | United Kingdom . |
| 2 077 487 | 12/1981 | United Kingdom . |
| 2 100 143 | 12/1982 | United Kingdom . |
| WO 94/02957 | 2/1994 | WIPO . |
| WO 94/02958 | 2/1994 | WIPO . |
| WO 96/13620 | 5/1996 | WIPO . |

OTHER PUBLICATIONS

Ferrario, B., "Use of Getters in Vacuum Systems–Extended Abstract," *Vacuum,* vol. 37, No. 3/4, 1987, pp. 375–377.

Sciuccati, F. et al., "In situ Pumping with NEG (non–evaporable getters) during Vacuum Processing," *Vacuum,* vol. 38, Nos. 8–10, 1988, pp. 765–769.

"SORB–AC® Getter Wafer Modules and Panels," SAES Getters S.p.A., Italy, Oct. 1988.

Briesacher et al., "Recommended Pumping Semiconductor Manufacturing," Kayoiku Kaikan, 'Applications for Non–Evaporable Getter Pumps in Semiconductor Processing Equipment,' $10^{th}$ Symposium on ULSI Ultra Clean Technology, Nov. 9–10, 1989.

Briesacher, J. et al., "Non–Evaporable Getter Pumps for Semiconductor Processing Equipment," Ultra Clean Technology, vol. 1, No. 1, 1990, pp. 49–57.

Ferrario et al., "Chemical Pumping and its Applications in High and Ultra High Vacuum," *Le Vide, les Couches Minces—Supplement au No. 252,* May–Jul. 1990, pp. 103–105.

Lorimer et al., "Enhanced UHV Performance with Zirconium–Based Getters," *Solid State Technology,* Sep. 1990, pp. 77–80.

della Porta, Paolo, "Gettering, an Integral Part of Vacuum Technology," American Vacuum Society, $39^{th}$ National Symposium, Nov. 9–13, 1992.

della Porta et al., "The Characteristics of Getter Pumps, Getter Ion Pumps and their Combination," *SAES Technical Report TR* (Saes Getters S.p.A.), pp. 3–4.

GETTER PUMP MODULE AND SYSTEM INCLUDING FOCUS SHIELDS

CROSS REFERENCE TO RELATED APPLICATIONS

This application is a continuation-in-part of co-pending U.S. patent application Ser. No. 08/332,564, entitled IN SITU GETTER PUMP SYSTEM AND METHOD by Lorimer et al., filed Oct. 31, 1994; U.S. patent application Ser. No. 08/348,798, entitled GETTER PUMP MODULE AND SYSTEM by inventors Krueger et al. filed Dec. 2, 1994; U.S. patent application Ser. No. 08/521,943, entitled GETTER PUMP MODULE AND SYSTEM by inventors Krueger et al., filed Sep. 1, 1995; and U.S. patent application Ser. No. 08/826,866, entitled GETTER PUMP MODULE AND SYSTEM by inventors Krueger et al. filed Apr. 11, 1997; all of which are incorporated herein by reference.

BACKGROUND OF THE INVENTION

This invention relates generally to ultra-high vacuum systems, and, more particularly, to in situ getter pumps used in semiconductor manufacturing systems.

There are a number of processes which require ultra-high vacuum levels of, for example, $10^{-7}$ to $10^{-12}$ Torr. For example, high vacuum physics machines such as cyclotrons and linear accelerators often require a vacuum of the order of $10^{-}$–$10^{-12}$ Torr. Also, in the semiconductor manufacturing industry, ultra-high vacuums of approximately $10^{-7}$–$10^{-9}$ Torr are often required in semiconductor processing equipment Several pumps are often used in series or parallel to achieve ultra-high vacuum levels within a chamber. A mechanical (e.g. oil) pump is often used to reduce the pressure within a chamber to approximately 30–50 millitorr. These are often referred to as "high pressure" pumps since they only pump relatively high pressure gasses. Then, a high- or ultra-high vacuum pump, such as a molecular pump, cryopump, turbo pump, or the like, is used to reduce the pressure to approximately $10^{-7}14\ 10^{31\ 9}$ Torr. These are often referred to as "low pressure" pumps since they pump low pressure gasses. The pump-down time for a particular chamber can range from minutes to hours to days depending upon such factors as the size of the chamber, the capacity of the pumps, the conductance from the chamber to the pumps, and the desired final pressure.

In certain ultra-high vacuum applications, getter pumps have been used in conjunction with the aforementioned mechanical, molecular, and cryopumps. A getter pump includes getter materials comprising metals or metal alloys which have an affinity for certain non-noble gases. For example, depending upon the composition and temperature of the getter material, getter pumps have been designed which pump non-noble gases such as water vapor and hydrogen (which are typical impurities in ultra high vacuum systems).

For example, getter pumps provided by SAES Getters, S.p.A. of Milan, Italy, typically include getter material suitable for these applications. Getter pumps can operate from ambient temperatures to about 450° C., depending upon on the species of gas to be pumped, the getter composition, etc. A preferred getter material for prior art SAES getter pumps is St 707 getter material (which is an alloy of Zr—V—Fe) and which is produced by SAES Getters, S.p.A. of Milan, Italy. Another such material is St 101™ getter alloy, also available from SAES Getters, S.p.A., which is an alloy of Zr—Al. Some of these prior art getter pumps can be considered in situ pumps in that they are disposed within the high vacuum physics machines.

Some present getter pump designs employ getter devices comprising metal ribbons coated with a powdered getter material such as the St 707 and St 101™ getter alloys just described. The coated ribbons are pleated in a concertina fashion to increase the ratio of exposed surface area to the volume occupied by the coated ribbon, and to increase adsorption of desired gasses. Such pumps are manufactured by SAES Getters, S.p.A., and sold under the trade name SORB-AC®. In addition, other designs have employed sintered getter disks or substrates coated with getter material powders. Designs using coated substrates have drawbacks in that the total amount of getter material available for sorption is limited to the nominal surface area of the getter device substrate and the pump is less robust due to particulation over time.

It is has been suggested that getter pumps be provided for semiconductor processing equipment. For example, in an article entitled "Non-Evaporable Getter Pumps for Semiconductor Processing Equipment" by Briesacher, et al., and published in *Ultra Clean Technology* 1(1):49–57 (1990), it is suggested that any application which uses getters to purify processed gases for semiconductor processing can also utilize non-evaporable getter pumps for in situ purification and for the selective pumping of impurities.

The aforementioned Briesacher reference discloses that there are two possible operating scenarios for the use of getter pumps in a sputtering system, which is a type of semiconductor processing equipment. The first is the addition of the getter pump to the system to operate in parallel with conventional pumps (e.g. mechanical and cryopumps) of the system. In this scenario, the operation of the system is not modified in any way, and the getter pump merely serves as an auxiliary pump to lower the partial gas pressure of certain components of the residual gas in the chamber. The second scenario requires filling the chamber to a pressure in the range of $3 \times 10^{-3}$ to $6 \times 10^{-3}$ Torr, stopping the argon flow into the chamber, and sealing the chamber. The getter pump is then said to act as an "in situ" purifier for the argon. However, as discussed below, the pump is not truly "in situ" in that the active material is not within the volume of the processing chamber.

In a typical sputtering system, a noble gas (usually argon) is pumped into a chamber and a plasma is created. The plasma accelerates positively charged argon ions towards a negatively charged target, thereby causing material to become dislodged and to settle on the surface of the wafer. Getter pumps are well adapted for use with sputtering systems, since the only desired processing gas is a noble gas which is not pumped by the getter pump. Therefore, the getter pump can remove impurity gases from a sputtering chamber without affecting the flow of the noble gas required for the sputtering process.

The Briesacher reference was primarily an academic analysis of the practicality of using non-evaporable getter pumps in semiconductor processing equipment. Therefore, very little practical application of the theory is disclosed. Furthermore, while the Briesacher article uses the term "in situ" to describe a scenario for the use of a getter pump, it is clear from the description that the getter pump is external to the chamber and is considered "in situ" only in the sense that when the chamber is sealed and when no argon is flowing into the chamber, the volume within the getter pump can be considered to be connected to the chamber volume. According to the analysis presented by Briesacher, a valve must be placed between the getter containment vessel and the main chamber to protect the getter from atmospheric exposure that would deteriorate the getter and require additional regenerations. Such protection is imperative with the strip-type getters discussed in the Briesacher reference. Thus, the getter described by Briesacher is not truly "in situ" in that the getter pump surfaces are within a volume that is connected to the chamber volume through a restrictive throat, which greatly limits the conductance between the chamber and the pump. By "conductance" it is meant herein the ease with which a fluid (gas in this instance) flows from one volume (e.g. the processing chamber) to another volume (e.g. the pump chamber). Conductance is limited by the aperture size between the two chambers, which is typically the cross-sectional area of the throat of the cryopump.

SUMMARY OF THE INVENTION

The present invention provides an improved getter pump module and system including focus shields that are particularly well adapted for in situ pumping of semiconductor processing chambers.

In one preferred embodiment, the present invention includes getter pumps having multiple getter elements, the getter elements preferably comprising porous, sintered getter material. In some embodiments, metal hubs are provided in apertures of the getter elements to provide mechanical support for the getter elements. A heating element is disposed proximate to the getter elements and provides heat to activate the getter material and cause it to pump desired gasses. The getter elements and heat element are preferably partially surrounded by a focus shield that is positioned between the getter elements and a wall of a processing chamber that encloses the getter elements, the heater element, and the focus shield. The focus shield aids in the getter element activation and regeneration process by reflecting heat onto the getter material, as well as extending the time of efficient pumping by reducing the amount of heat seen by the wall of the processing chamber.

In the preferred embodiment, the heater element is a radiative heater used to heat the getter material. The getter elements can be included in a first getter assembly and a second getter assembly, where the heater element may be positioned between the first and second getter assemblies. In one embodiment, the focus shield includes a wedge-shaped portion having two wall portions angled toward the heater element that reflect the heat onto the getter assemblies. For example, the focus shield can be positioned to one side of the heater element.

In another embodiment, the focus shield includes at least one substantially planar extended portion coupled to the wedge portion. In other embodiments, multiple focus shields can be used. For example, a second focus shield can be positioned on the opposite side of the heater element from the first focus shield. The second focus shield may include a wedge-shaped portion having two wall portions angled toward said heater element, similar to the first shield, to allow higher temperatures to be reached more quickly.

In another embodiment, the first getter assembly is closely positioned over the second getter assembly and wherein the heater element is provided on one side of the getter assemblies. A first focus shield, preferably including an angled portion shaped like a wedge and at least one extended portion coupled to the wedge, is provided on one side of getter assemblies. A second focus shield, e.g. a planar shield, is preferably positioned on the other side of the heater element such that the heater element is positioned between the second focus shield and the getter assemblies. The focus shields can also include curved portions instead of or in addition to planar or angled portions.

A method of the present invention for processing a wafer includes a step of placing a wafer within a wafer processing chamber including an in situ getter pump disposed within the chamber. The in situ getter pump includes multiple getter elements positioned advantageously (e.g., near a wall of the chamber or elsewhere where there is sufficient space), a heater, and a focus shield provided between the getter elements and the wall of the chamber, and where the shield has walls proximate to the getter elements and to the heater. The chamber is sealed and the wafer is processed within the chamber while pumping the chamber with the in situ getter pump and with a primary pumping system. Preferably, the method further comprises heating the interior of the chamber to a high temperature to bake out said chamber and activate the getter elements (the getter elements usually need to reach 550° C. to be activated; the other portions of the chamber need not be heated to this temperature). For example, a noble gas is flowed into the chamber while simultaneously pumping the chamber with an external low pressure pump and the in situ getter pump. Thus, the low pressure pump removes impurities (noble and non-noble gasses) from the chamber and the in situ getter pump removes non-noble gasses from the chamber. The wafer is processed in the chamber while flowing the noble gas into the chamber. The present invention also includes the wafer produced by the method of the invention.

The present invention also includes a method for pumping a chamber, which includes sealing the chamber from the external atmosphere and pumping the chamber with an in situ getter pump disposed within the chamber.

Additional aspects and advantages of the invention will become more apparent when the following description is read in conjunction with the accompanying drawings.

BRIEF DESCRIPTION OF THE DRAWINGS

FIG. 4A is a sectional view of a single getter element taken along the line 4A—4A of FIG. 3. FIG. 4B is a sectional view of three abutting getter elements, also along taken the line 4A—4A of FIG. 3.

FIG. 6A illustrates dimensional parameters of adjacent getter elements in a arcuate configuration. FIG. 6B illustrates dimensional parameters for adjacent parallel getter elements.

FIG. 14A illustrates a closed configuration in which the getter elements are thermally isolated. FIG. 14B is an illustration of an open configuration in which the getter elements are exposed to the surrounding environment.

DESCRIPTION OF THE PREFERRED EMBODIMENTS

Figure 1:
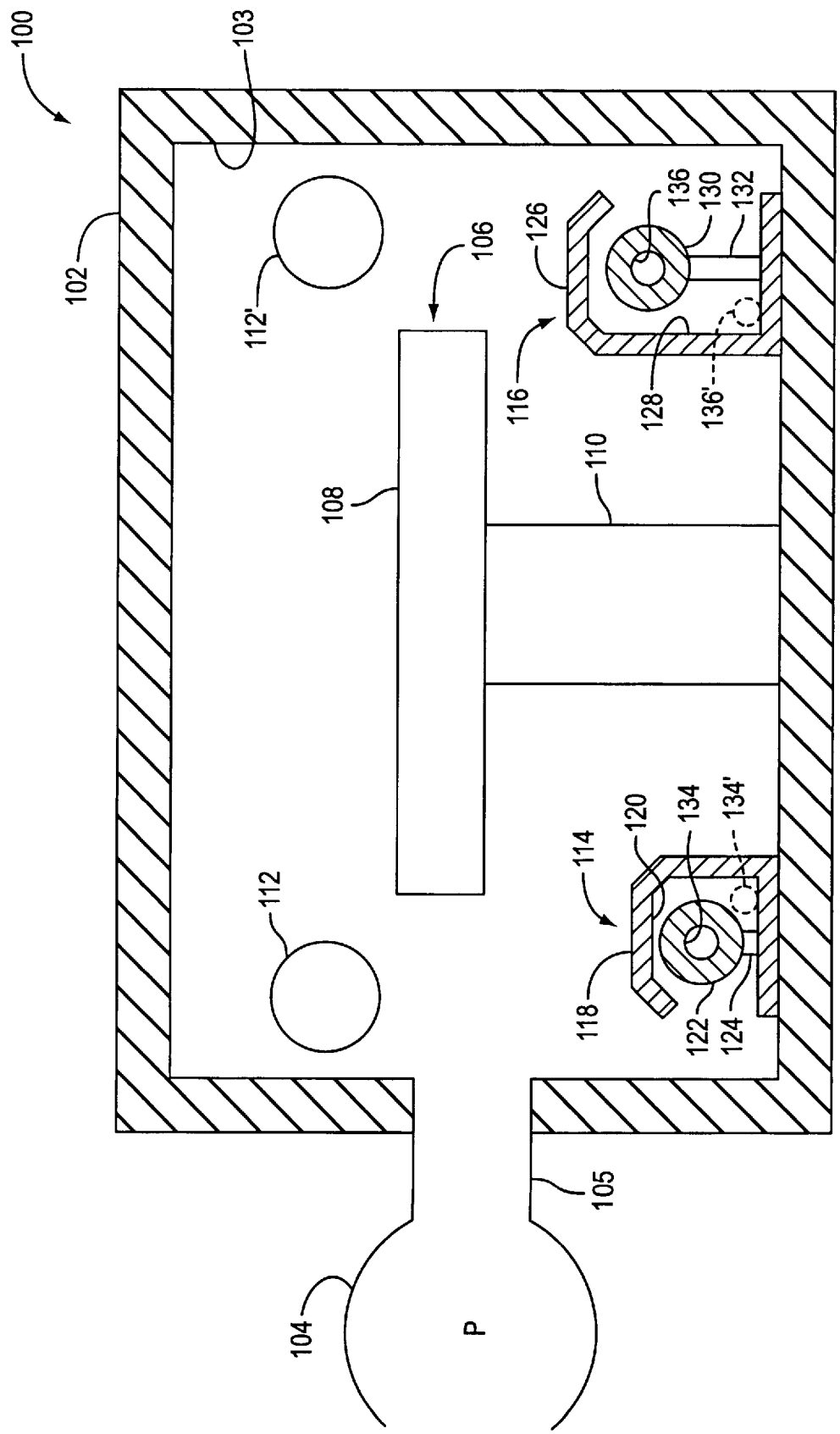
FIG. 1 is a pictorial representation of a semiconductor processing system, including an in situ getter pump module of the present invention

FIG. 1 illustrates a portion of a semiconductor processing system 100 in accordance with the present invention. The processing system includes a wafer processing chamber 102 having an interior wall 103. An external pump 104 ("P"), such as a cryopump and/or a mechanical pump, is coupled to the chamber by a conduit 105 to reduce the internal atmospheric pressure of the chamber before the getter pump module is operated. Preferably, the internal pressure of the chamber is brought to a level of about $10^{-6}$ bar before the getter pump is activated. Inside chamber 102 is included a sputtering stage 106 which includes a chuck 108 that rests atop a support 110. Also included are heat lamps 112 and 112' and at least one in situ getter pump module such as shown generally at 114 and 116. Chamber 102 typically is one component of a multi-component semiconductor processing system which includes, inter alia, various power sources, analyzers, cryopumps, plasma generators, low vacuum pumps, high vacuum pumps and controllers. These other components, including their design, manufacture and operation, are well known to those of skill in the art.

As used herein, the phrase "in situ getter pump" will refer to a getter pump where the active elements, i.e. the active getter material, is physically located within the same volume of space as the wafer being processed. As such, the conductance between the in situ getter material and the process chamber is very high compared to the coupling of an external getter pump to the chamber through a gate valve, conduit, the throat of a pump, etc. This results in a relatively high pumping speed. For example, with an in situ getter pump of the present invention, more than 75% of maximum theoretical pumping speed can be achieved, as compared to at best 75% of maximum theoretical pumping speed for an external getter pump coupled to the processing chamber with a gate valve or the like.

The getter pump module 114 and/or 116 is "activated" by heating the getter material of the getter pump to a high temperature, e. $\geq 550°$ C. This activation of the getter pump is required because the getter material becomes "passivated" upon exposure to the atmosphere, and will overlap with a "bake-out" step wherein lamps 112 and 112' are used to bake out the chamber to rid the chamber of residual gasses, moisture, etc. The bake out period and the activation periods need not coincide, although they can be linked, e.g., if the lamps are provided with some power during bake-out, e.g. 20% or greater power for more than 2 or 3 minutes, at least a partial activation or warming of the getter may occur to a point where it is dangerous to vent to air.

With continuing reference to FIG. 1, in situ getter pumps 114 and 116 will now be described in greater detail. Pumps 114 and 116 preferably include thermally isolating shields 118 and 126 respectively. The shields may further include thermally reflective interior walls 120 and 128 to enhance the regeneration of the getter elements by reflecting back heat to the getter elements. Within the thermally isolating shields are getter assemblies 122 and 130 which are supported on supports shown generally at 124 and 132. Getter assembly 114 is illustrative of a "low boy" configuration which may be required due to space limitations within the processing chamber. Getter module 116 is an example of a "high boy" configuration which provides a relatively greater conductance between the getter assembly 130 and the interior of the processing chamber due to a relatively greater opening than that which is provided by the low boy configuration. Other, more preferred embodiments of getter modules include multiple getter assemblies provided around a heater unit, as, for example, described below with respect to FIGS. 19–22.

The getter pumps 114 and 116 further include heaters 134 and/or 134', and 136 and/or 136', respectively, for heating the getter material to temperatures effective to "activate" the getter material as described above, and/or to control the adsorption characteristics of the getter material as is well known in the art. Heaters 134, 134', 136 and 136' can be resistive heaters, Le., heaters that use at least in part electrical resistance for heating, or radiative heaters, ie., heaters that employ radiation to effect heating of nearby surfaces. Preferably, heaters 134 and 136 are resistive heaters and are disposed through an aperture in the getter elements as will be described in greater detail below. It will be appreciated that heaters 134 and 136 can also fulfill a support function, supporting the getter elements in addition to heating the getter material. Heater elements 134' and 136' are preferably radiant heaters and are disposed proximate to the getter material and the walls of the thermally isolating shield. It will be appreciated that heater elements 134' and 136' may be disposed at various locations within the thermally isolating shield. Preferred locations are those from which the heaters can efficiently heat the getter material to the desired temperatures without affecting significantly structures within the processing chamber.

Figure 2:
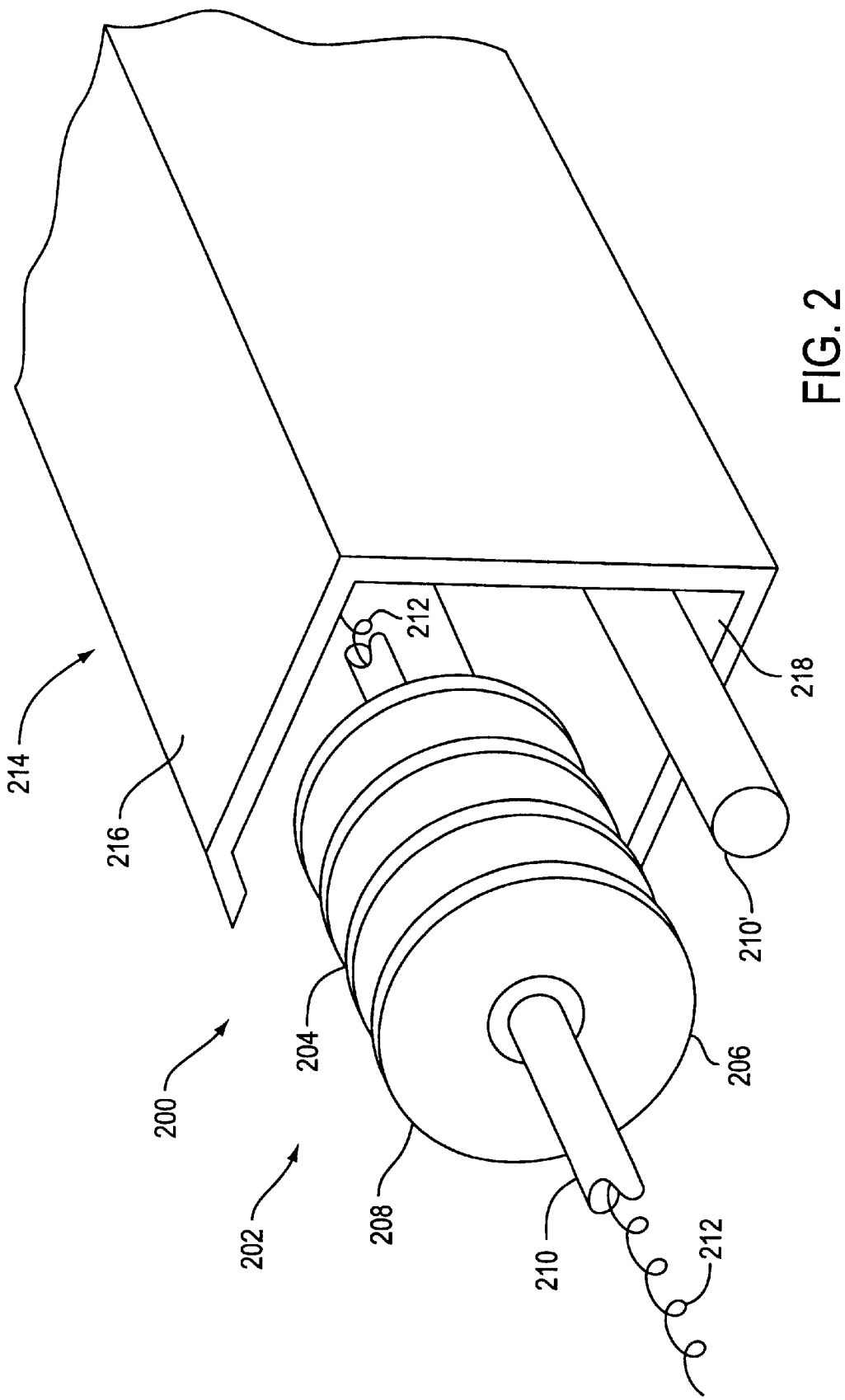
FIG. 2 is a partial perspective view a number of getter elements of the invention and a thermally isolating shield.

One embodiment of an in situ getter pump is illustrated at 200 in FIG. 2. The pump includes a getter assembly 202 and an elongated, box-shaped thermally isolating shield 214, which, in the described embodiment, thermally isolates the getter assembly from the interior of the semiconductor processing chamber 10. The shield 214 can be eliminated if the getter assemblies are positioned or otherwise shielded from the heated surfaces in the chamber. However, shields can also be used to focus heat toward the getter assembly to allow the temperature of getter assemblies to be increased more quickly during the activation phase of the getter materials and increases the efficiency of the getter pump. These types of focus shields may also be needed to ensure temperatures from the heating element are sufficient to activate the getter material. Focus shields of the present invention are described below with reference to FIGS. 19–22.

Getter assembly 202 includes a plurality of disk-shaped getter elements 204, each comprised of getter material 206. The getter elements preferably include a centrally located aperture 208, through which aperture extends a support element 210 to physically support the elements. In a preferred embodiment, the aperture is a substantially cylindrical bore extending through the getter element. Other aperture configurations will be recognized to be equivalent. Support element 210 can further include a resistive element 212 running through the support element to form a resistive heating element to heat the getter elements to a regeneration temperature in addition to lower-than regeneration temperatures at which the getter material will remove certain gasses preferentially from the atmosphere as is well known in the art. The support element preferably is of a tubular, cylindrical design formed from stainless steel, and is dimensioned to engage with the aperture to provide contact, including thermal contact, with the getter elements. Support elements are available commercially from various suppliers. Support elements which are effective to act as heating elements are sold commercially by Watlow.

In a preferred embodiment, the heating of the getter material is performed using heater element 210' located proximate to the getter material. Heating element 210' is preferably a radiative heater, e.g., a Sylvania quartz infrared lamp such as available commercially from Osram-Sylvania of Winchester, Ky., USA. Preferably, the heating element 210' runs in a direction substantially parallel to the path defined by the axes of the getter elements, which can be supported by a simple (i.e., unheated) rod, preferably of stainless steel. It will be appreciated that a metal supporting rod can also provide heat to the getter material by conduction. Other arrangements of the heater and getter elements will be apparent to those of skill in the art. For example, the getter elements may be held in other fashions, such as by their edges. The heating element can be a single integral heating element, as shown in FIG. 2, or it can comprise a series of discrete heating elements.

The thermally isolating shield 214 comprises an exterior surface 216 which is effective to block radiant heat from the external heat sources within the chamber from affecting the getter elements. The shield may also include a thermally reflective interior surface 218 facing the getter elements which functions to increase regeneration efficiency by reflecting heat back onto the getter assemblies during their regeneration. In addition, the interior surface of the shield can also serve to prevent heat from the regeneration of the getter elements from reaching surfaces within the chamber outside of the thermally isolating shield 214. In a preferred embodiment, the shields are made from 316 Stainless Steel which as been electropolished to about 25 RA.

Figure 3:
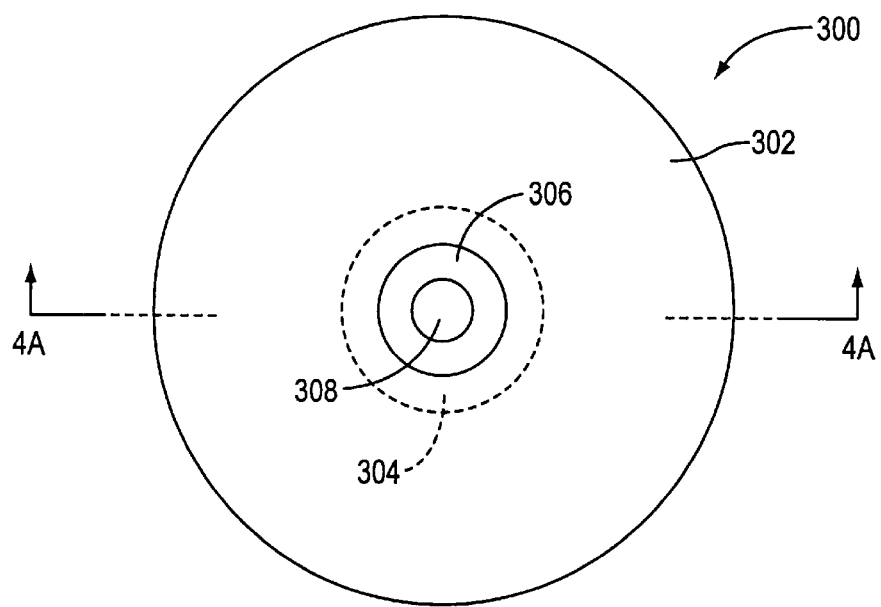
FIG. 3 is a facing view of a getter element of FIG. 2.

A preferred embodiment of a single getter element is shown in FIG. 3 at 300. This preferred getter element comprises a solid, porous, sintered disk of getter material 302 which disk includes a non-getter metallic hub 304 disposed within the aperture of the disk and a non-getter metallic spacer 306. The spacer and hub define an aperture 308 which is preferably cylindrical and dimensioned to receivably engage the support/heating element. In preferred embodiments, both the hub and spacer are made from titanium. As used herein, the term "disk" refers to a getter element having a substantially circular or ovoid outer periphery and a surface area in excess of its thickness. Although a substantially planar getter element is preferred for reasons which will become apparent below, deviation from planarity is also encompassed by the present invention.

By "solid" it is meant that the getter material comprises the body of the getter element, such as described in U.S. Pat. No. 5,320,496 to Manini, et al., entitled "High-Capacity Getter Pump", and which is incorporated herein by reference, as opposed to other getter elements wherein getter material is adhered to a substrate surface. By providing a solid, porous getter disk, pumping efficiency and impurity capacity is greatly increased since molecules can be adsorbed deep into the body of the getter element, rather just on the surface as with prior art getter elements.

The getter elements can be made from a variety of getter materials, depending upon their desired properties. Typical getter materials include alloys of zirconium, vanadium and iron as disclosed in U.S. Pat. Nos. 3,203,901, 3,820,919, 3,926,832,4,071,335; 4,269,624,4,428,856, 4,306,887,4, 312,669, 4,405,487, 4,907,948 and 5,242,559; and British Patent No. 1,329,628 and British Patent Application No. GB 2,077,487A; and German Patent No. 2,204,714, each of which is incorporated herein by reference. Additional types of getter materials include, among others, titanium, hafnium, uranium, thorium, tungsten, tantalum, niobium, carbon and alloys thereof.

A preferred getter material comprises a zirconium-vanadium-iron ternary alloy having a weight composition such that the percentages of weights of the three metals, when plotted on a ternary composition diagram fall within a triangle whose vertices lie at a) 75% Zr/20% V/5% Fe; b) 45% Zr/20% V/35% Fe; and c) 45% Zr/50% V/5% Fe. More preferably, the getter material comprises a ternary alloy having a composition of 70% Zr/24.6% V/5.4% Fe by weight, which ternary alloy is sold under as St 707 by SAES GETTERS, S.p.A. Such materials are described in U.S. Pat. No. 4,312,669 and British Patent Application No. GB 2,077, 487A.

Another preferred getter alloy is one made from zirconium and aluminum, comprising about 84% zirconium by weight and 16% aluminum by weight. Such material is sold under the trade name St 101® by SAES Getters S.p.A. Still another preferred getter material comprises 17% carbon and 83% zirconium by weight and is sold under the trade name St 171® by SAES Getters S.p.A. Yet another preferred getter material comprises 82% zirconium, 14.8% vanadium and 3.2% iron by weight and is sold under the tradename St 172 by SAES Getters S.p.A. Another preferred getter material comprises 10% molybdenum, 80% titanium and 10% titanium hydride ($TiH_2$) by weight and is sold under the tradename St 175 by SAES Getters S.p.A. Another preferred getter material comprises about 85% zirconium and about 15% aluminum by weight and is sold under the trade name St 182 by SAES Getters S.p.A. Those of skill in the art will appreciate that these and other getter materials can be prepared by analogy to the descriptions in the above-cited patents and patent applications.

Highly porous getter materials tend to be preferable to less porous materials in that they tend to have higher adsorption capabilities. Such porous getter materials can be prepared in accordance with the descriptions in U.S. Pat. No. 4,428,856, which describes the preparation of porous getter bodies from a mixture of powders including titanium, titanium hydride and a refractory metal chosen from the group consisting of tungsten, molybdenum, niobium and tantalum; British Patent Application No. GB 2,077,487A, which describes the preparation of porous getter material from a mixture of zirconium and the above-described ternary alloy; and German Patent No. 2,204,714 which describes the preparation of a porous getter material comprising a mixture of zirconium and graphite powders.

Preferred getter materials and their preparation are described in British Patent Application No. GB 2,077,487A. The preferred getter mater-als comprise mixtures of zirconium powder with the above-described ternary alloy in a ratio of between 4 parts zirconium to 1 part ternary alloy and 1 part zirconium to 6 parts ternary alloy by weight More preferably, the zirconium:ternary alloy ratio is between 2:1 and 1:2. The ternary alloy can be formed, for example, by combing zirconium sponge with commercially available iron-vanadium alloy (Murex, United Kingdom) in a fusion furnace under reduced pressure until molten, cooling the molten material, and milling the resulting solid to a powder.

Formation of the getter elements can be accomplished using a process which comprises placing a hub (described below) into a getter element mold, adding the alloy and the zirconium powders and sintering the material at a temperature between about 1000° C. and 1,100° C. for a period of between about 5 minutes and about 10 minutes.

Figure 4A:
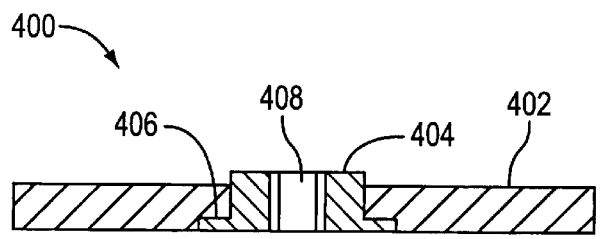
FIGS. 4A and 4B illustrate sectional views of getter elements of the invention.

FIG. 4A shows a cross section of the getter element shown in FIG. 3 taken along the line 4A—4A at 400. As shown in FIG. 4A, the getter element includes a porous sintered disk of getter material 402 which disk includes a hub 404 of non-getter material disposed in an aperture within the disk. The hub includes a foot 406 and a central aperture 408. Preferably, the foot of the hub is substantially flush with the disk surface while the opposite end of the hub extends above the surface of the disk. However, it will be appreciated that either or both ends of the hub may extend above the disk.

The diameter of a preferred getter element of the present invention is about 25.4 millimeters (mm), although getter elements having other diameters can be used in other embodiments. The thickness of the getter disk is preferably, about 1.3 mm. A preferred hub embodiment includes a substantially circular foot having a diameter of about 8.0 mm, and a foot height of about 0.3 mm; and a substantially circular raised portion extending from the foot, the raised portion having a diameter of about 6.0 mm and a height of about 1.7 mm (i.e., the total height of the hub is about 2.0 mm). Thus, in the preferred embodiment the raised portion extends above the getter material at a height of about 0.7 mm from the disk surface. The diameter of the aperture extending through the hub that receives the heating element or support is about 3.8 mm to 4.2 mm.

Figure 4B:
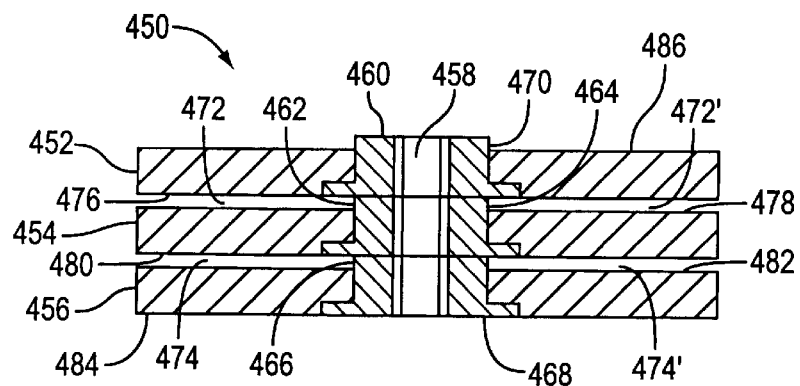

In preferred embodiments, getter pumps are constructed from a plurality of getter disks which are placed adjacent each other along the axis defined by the disks' apertures. Such an embodiment is illustrated in FIG. 4B at 450. As shown in FIG. 4B, the getter elements includes a first disk 452, a second disk 454, and a third disk 456. Each disk is aligned such that a central aperture 458 is formed by the apertures of the individual disks. In order to maximize the available surface area, it is preferable to stack the disks such that the hub of any one disk is substantially touching the spacer of an adjacent disk. Thus, hub 460 of disk 452 is shown in contact with spacer 462 of disk 454, and hub 464 of disk 454 is in contact with spacer 466 of disk 456. It will be appreciated that the spacers provide gaps through which the getter materials can interact with the atmosphere to which the getter pump is exposed. Such gaps are illustrated at 472 and 472', which are formed by opposing faces 476 and 478; and gaps 474 and 474', which are formed by opposing faces 480 and 482. As shown in the Figure, faces 484 and 486 of the getter elements at the ends of the stack are free. Typically, however, there will be many getter elements stacked to provide many such gaps.

Figure 5:
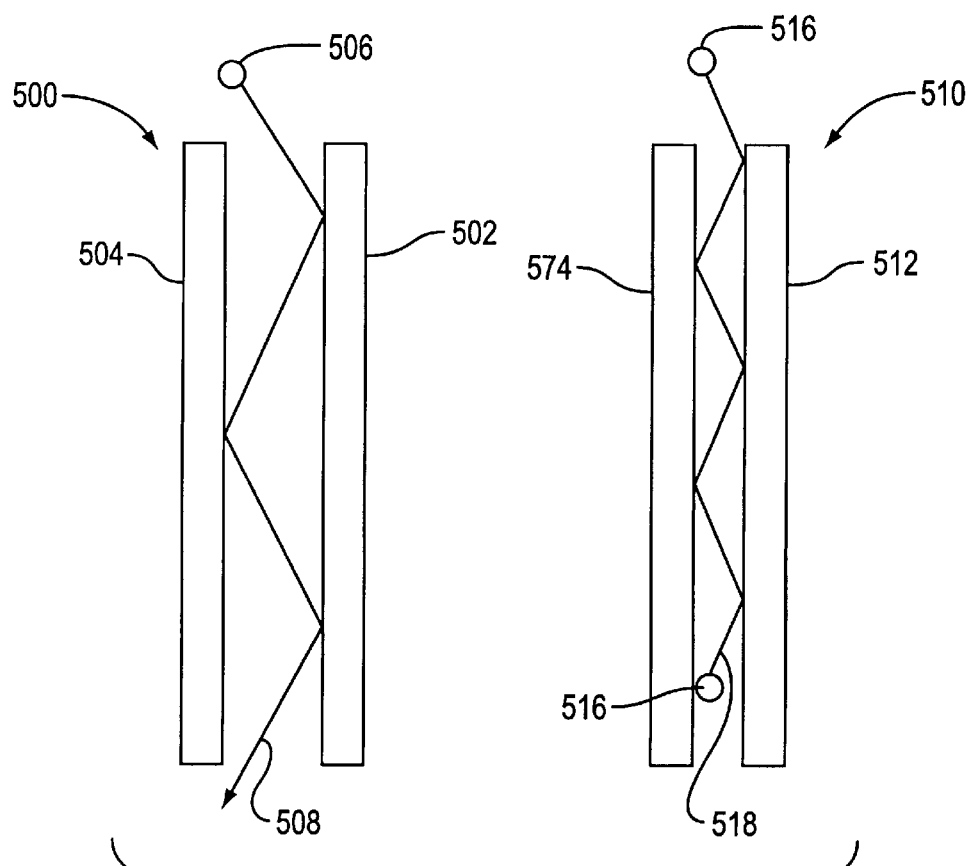
FIG. 5 is an illustration of the number of collisions between a molecule and two adjacent getter elements of the invention as a function of the distance between the getter elements.

Referring to FIG. 5, the parameters required for optimal pumping function will be discussed. As it is well known in the art, the efficiency of a getter pump is related to the distance between the getter elements. If the getter elements are spaced too widely, gas molecules will pass between the walls after a few, or no collisions with the getter material. This is illustrated at 500 where adjacent getter elements 502 and 504 are spaced at a distance which allows molecule 506 to collide with either opposing face of the getter elements only a few times along path 508 before passing between the disks without being adsorbed. Conversely, as the getter elements are brought together, more collisions between the molecule and the getter element surfaces occur, thereby increasing the likelihood that the molecule will be trapped by the getter material. This is illustrated at 510 where opposing getter elements 512 and 514 are spaced close enough that molecule 516 collides several times along the opposing getter element faces along path 518. Each time the molecule collides with a getter element surface, there is a certain probability that the molecule will stick to the surface and become absorbed therein. Thus, a greater number of collisions between the molecule and the surface will yield a correspondingly greater likelihood that the molecule will be trapped by the surface. However, if the getter elements are placed too close together (e.g., if they abut each other), the edge area of the disk will become the dominant pumping surface, which is less effective than the facing surfaces of the disks.

Figure 6A:
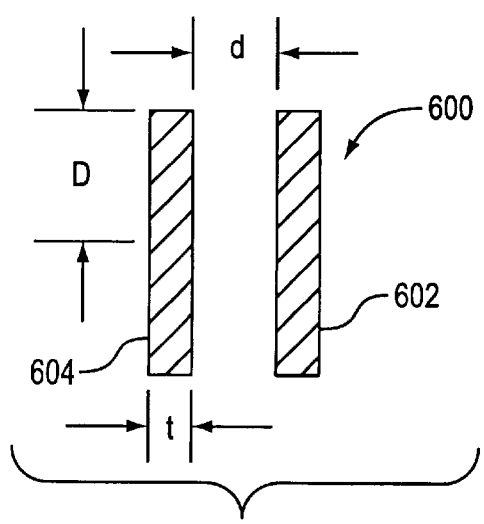
FIGS. 6A and 6B illustrate certain dimensional parameters of the getter elements of the invention.
Figure 6B:
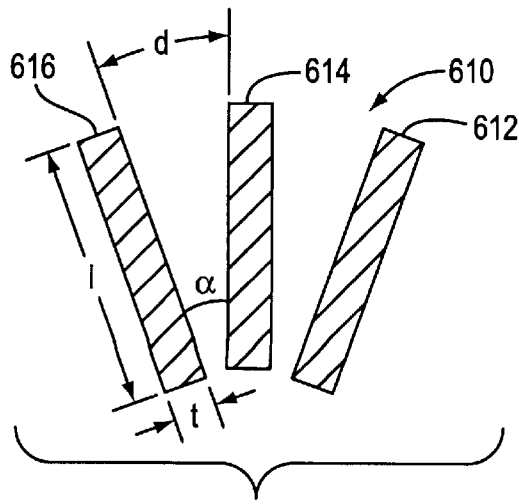

In view of the foregoing, preferred getter element designs will take advantage of the above-described properties to optimize the efficiency of the getter pump by employing various geometries, see, e.g., WO 94/02957, published Feb. 3, 1994, to Ferrario, et al., and Technical Paper TP 202, American Vacuum Society 39th National Symposium (1992), both of which are incorporated herein by reference. The relevant parameters to be considered are shown in FIG. 6A by reference to opposing disks 602 and 604. The relevant parameters include the disk radius "D," inter-element spacing "d" and disk thickness "t." In some embodiments, the getter elements will be arranged in a fan pattern such as that shown at 610 in FIG. 6B. There, disks 612, 614, and 616 are arranged in an arcuate pattern having an angle "α" between the disks. Thus, the inter-element spacing d will be related to the angle α and the length 1 of the getter element.

Figure 7:
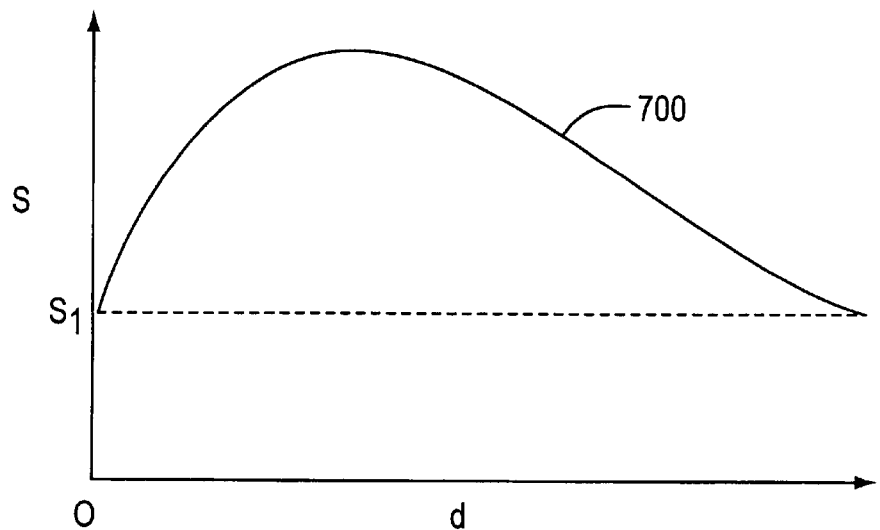
FIG. 7 is a graphical representation of the relationship between pumping speed and the distance "d" between adjacent getter elements.

The above-described relationship between the arrangement and dimensions of the getter elements and the efficiency of the getter pump is illustrated in FIG. 7 along path 700, which shows the relationship between pumping speed "S" and the inter-element distance "d" as determined by experimental tests of disk performance as a function of the above-described parameters. As seen in FIG. 7, when the getter elements are touching, i.e., when d=0, the pumping speed is at the value "$S_1$." As the inter-element spacing increases, the pumping speed increases until reaching a maximum at which point further increases in the distance between getter elements allow fewer molecular reflections between the disks; thereby increasing the probability that the molecule will pass between the surfaces of the disks. By extending the distance between adjacent getter elements sufficiently, the pumping speed can be decreased below that for the case where all of the getter elements are touching. The optimum parameters for disk spacing can be determined by plotting the pumping speed versus the disk spacing and finding the maximum of the resulting distribution. For the aforementioned 25.0 mm diameter disk shaped getter elements, a spacing of about 0.7 mm is preferred for pumping $H_2$, a common impurity gas in semiconductor processing operations. It will be appreciated that other disk spacings may be preferred for pumping impurity gases other than $H_2$.

Figure 8:
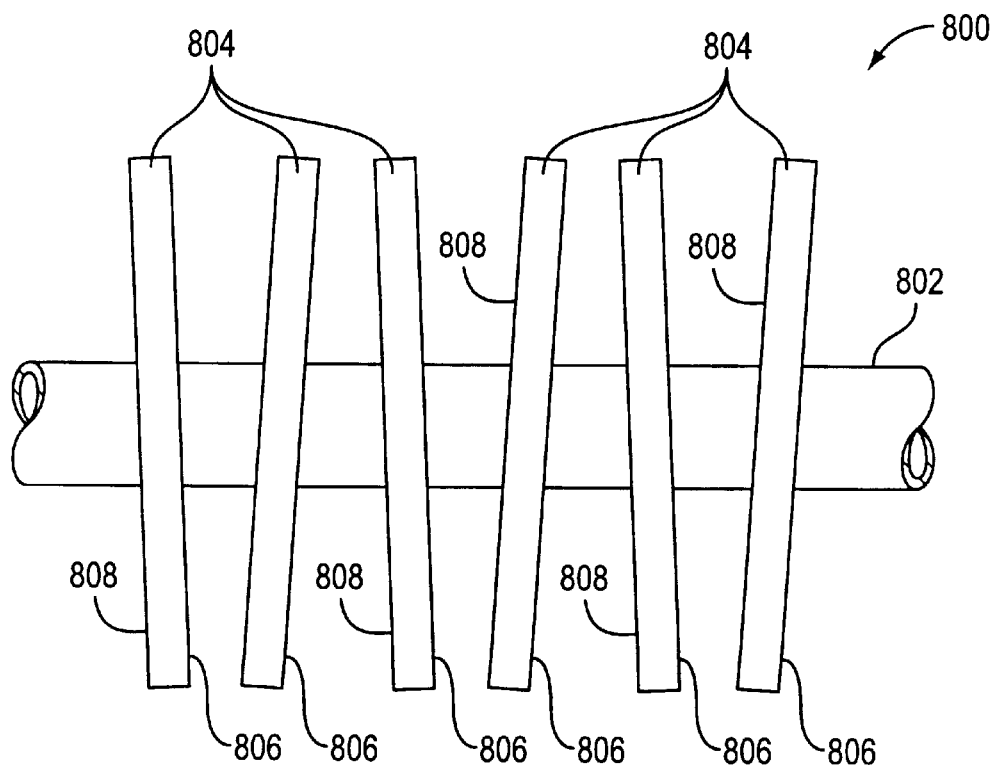
FIG. 8 is an illustration of another embodiment of the invention wherein adjacent getter elements are arranged at opposing angles.

A preferred embodiment employing the above-described relationship between getter element spacing and pumping speed is illustrated in FIG. 8 at 800. There, the opposing faces of the adjacent getter elements are not parallel with respect to each other, relative to the axes defined by the apertures of elements 804, which apertures are aligned along an axis that is parallel to heating element 802. As will be appreciated from the illustration, the axes of elements 804 are arranged such that the surface planes 806 and 808 are not perpendicular to the axis defined by the apertures. In one embodiment, the apertures of the adjacent getter elements are inclined along the axis at opposing angles, thus allowing adjacent getter elements to form a partial "V" shape.

Figure 9:
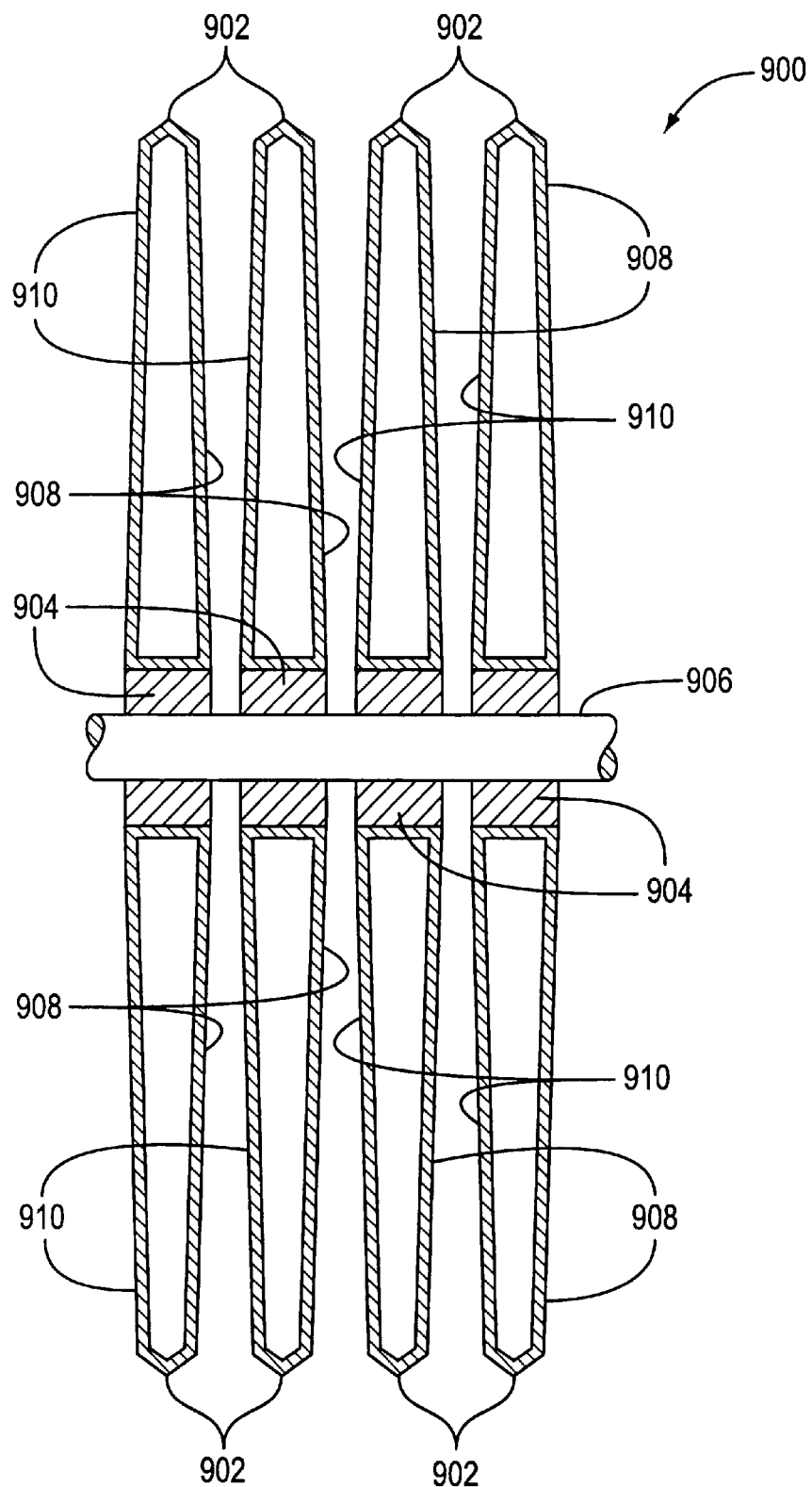
FIG. 9 is an illustration of yet another embodiment of the invention wherein the facing sides of adjacent getter elements are non-parallel.

FIG. 9 shows an alternative embodiment wherein adjacent getter elements 902 include hubs 904 having apertures that are substantially perpendicular to their common axis. In this embodiment, the faces of the adjacent getter elements are inclined relative to the axis formed by their apertures. In preferred embodiments, the opposing faces of the getter elements, shown generally at 908 and 910, are inclined relative to the axis and at opposing angles. Such an arrangement provides for a steady narrowing of the inter-element distance proceeding from the peripheral edges of the getter elements toward their hubs. Preferred angles and distances are described in Briesacher, et al., *Ultra Clean Technology* 1(1):49–57 (1990), which is incorporated herein by reference.

Figure 10:
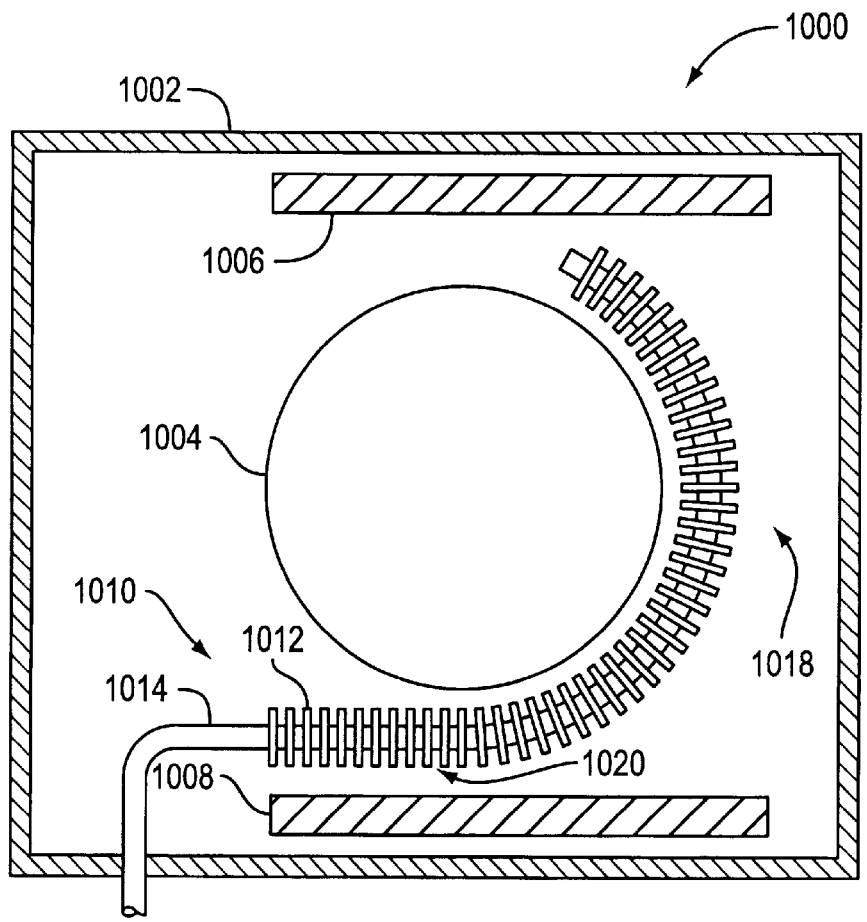
FIG. 10 illustrates an embodiment of the invention wherein an array of getter elements is arranged partially circumferentially around a sputtering platter.

Certain embodiments of the invention include straight and curved getter pump segments to accommodate the space restrictions inherent in semiconductor processing chambers. As shown in FIG. 10 at 1000, a processing chamber having a wall 1002, heat lamps 1006 and 1008, and a sputtering stage 1004, includes a getter pump 1010 having getter elements 1012 supported on heating element 1014 The getter pump includes curved portions 1018 and straight portions 1020 which allow placement of the getter pump in close proximity to the sputter stage 1004. It will be appreciated by those of skill in the art that maintaining close proximity of the getter pump to the stage facilitates the pumping of non-noble gasses to produce a low-impurity partial pressure where such a partial pressure is most important-near the wafer being processed.

It will be further appreciated by those skilled in the art that the placement of the getters within an elongate, box-shaped shield structure such as shown in FIG. 2 can provide uneven exposure of the getter elements, with those portions of the getter elements closer to the aperture receiving greater exposure to the chamber atmosphere than those portions of the getter elements closer to the interior of the shields. Such an arrangement therefore could underutilize the sorptive capacity of the getter elements.

Figure 11:
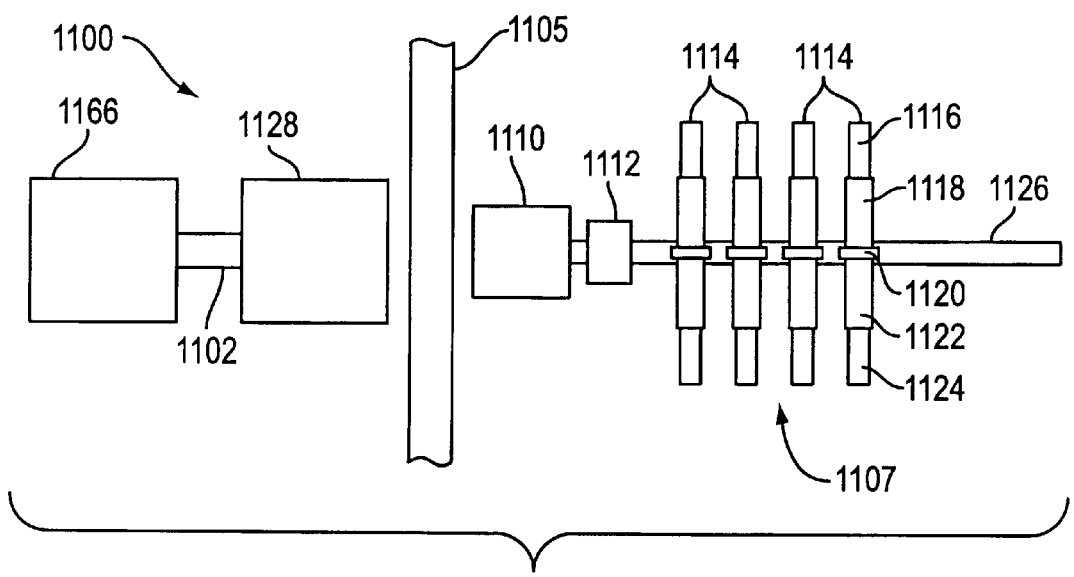
FIG. 11 is an illustration of an embodiment of the invention wherein star-shaped arrays of getter elements are supported on a rotating support element.

An embodiment of the getter segments of the present invention that would substantially avoid this potential problem is illustrated in FIG. 11 at 1100. There, a shaft 1102 of a motor 1106 is coupled to a magnetic coupling device 1128 disposed on the outer side of a chamber wall 1105. A second magnetic coupling device 1110 is disposed on the other (inner) side of the chamber wall 1105. The magnetic coupling device 1110 is coupled to the support/heater element 1126 by a connector 1112. Optionally a heater element (not shown) external to the getter elements may be used with support/heater element 1126.

In this alternate embodiment, getter pump module 1107 comprises a plurality of star-shaped getter assemblies 1114, which assemblies each include a hub having a centrally located aperture and a plurality of getter elements 1116, 1118, 1120, 1122 and 1124 extending radially from the hub. The getter elements in this particular embodiment of the invention are substantially paddle shaped, i.e., the getter elements have a substantially rectangular or fan shaped cross section along an axis which is longer than the width or depth of the getter element. The getter assemblies are supported by a heating element 1126 which rotates in the direction indicated.

Figure 12:
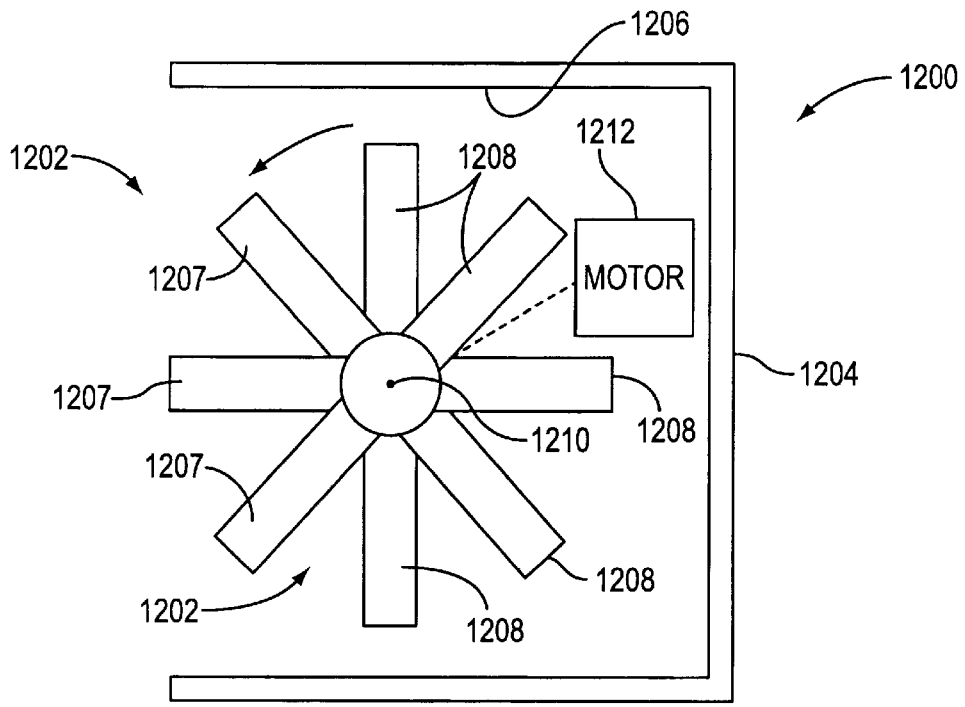
FIG. 12 is a side view of the embodiment shown in FIG. 11, but wherein the getter elements are inside a thermally isolating shield.

Those skilled in the art will appreciate that such an embodiment will increase the utilization of the capacity of the getter elements, as illustrated in FIG. 12 at 1200, where rotating getter pump 1202 is placed inside shield 1204. As the Figure illustrates, getter elements 1207 are in close proximity to the aperture of shield 1204, thereby receiving greater exposure to the chamber atmosphere relative to getter elements 1208 which are in close proximity to the interior shield wall 1206. Rotation about central hub 1210 using motor 1212 allows the lesser exposed getter elements 1208 to be moved forward toward the aperture while the more exposed getter elements 1207 are moved toward the rear of the shield. Thus, the exposure across all of the getter elements is more uniform.

Referring back to FIG. 2, it will be noted that in some embodiments, a thermally isolating shield is provided to isolate thermally the getter pump from the processing chamber. Such isolating is advantageous as it protects the getter elements from the effects of the heat lamps that are used to "bake-off" residual gases from the surfaces of the walls and other components in the processing chamber, and, conversely, to protect the components in the chamber from heat released from the getter pump during regeneration of the getter elements.

Figure 13:
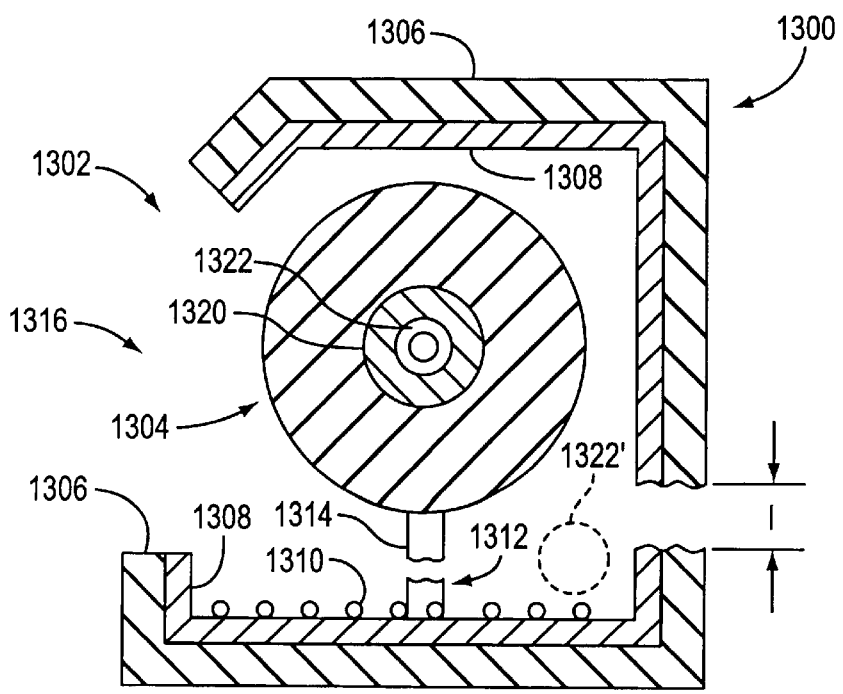
FIG. 13 is a side view of the embodiment illustrated in FIG. 2, but wherein the getter elements are inside a thermally isolating shield.

Referring now to FIG. 13, a thermally shielded getter pump is illustrated at 1300. The shielded getter pump includes a box-like thermally isolating shield 1302 shielding getter elements 1304, which getter elements are supported by a support 1314. The thermally isolating shield preferably comprises an outer surface 1306 and a thermally reflective inner surface 1308 which inner surface faces the getter elements 304. In preferred embodiments, the thermally isolating shield includes a floor shown generally at 1312. The thermally isolating shield will include an aperture such as shown at 1316 to allow contact between the atmosphere in the processing chamber and the getter elements. The shields are preferably made from a suitably thermally reflective material, such as, but not limited to, "316 Stainless Steel", and the interior surface of the shields may be coated or plated (such as with nickel) to enhance reflectivity. Alternatively, the shield may be polished or electropolished to enhance reflectivity, reduce porosity (which reduces gas and moisture adsorption), and minimize particulate contamination. Within central hub 1320 is disposed support/heater element 1322. Optionally, an external heater 1322' can be used.

In some embodiments, the thermally isolating shield is an elongate, stationary box shaped structure which may be fixed to one or more surfaces of the chamber interior. In some embodiments, the getter elements will be spaced relatively uniformly between the top, sides and bottom of the thermally isolating shield. Such an embodiment is commonly referred to as the aforementioned "low boy" structure. In other embodiments, the spacing between the getter elements and the floor of the thermally isolating structure is larger than the spacing between the getter elements and the remaining sides of the thermally isolating shield. Such embodiments are typically referred to as the aforementioned "high boy" structure. These embodiments are denoted in FIG. 13 by tie parameter "1". Preferably, 1 is about 0 mm for the "low boy" configuration and between about 13 mm and about 25 mm for the "high boy" configuration.

Figure 14B:
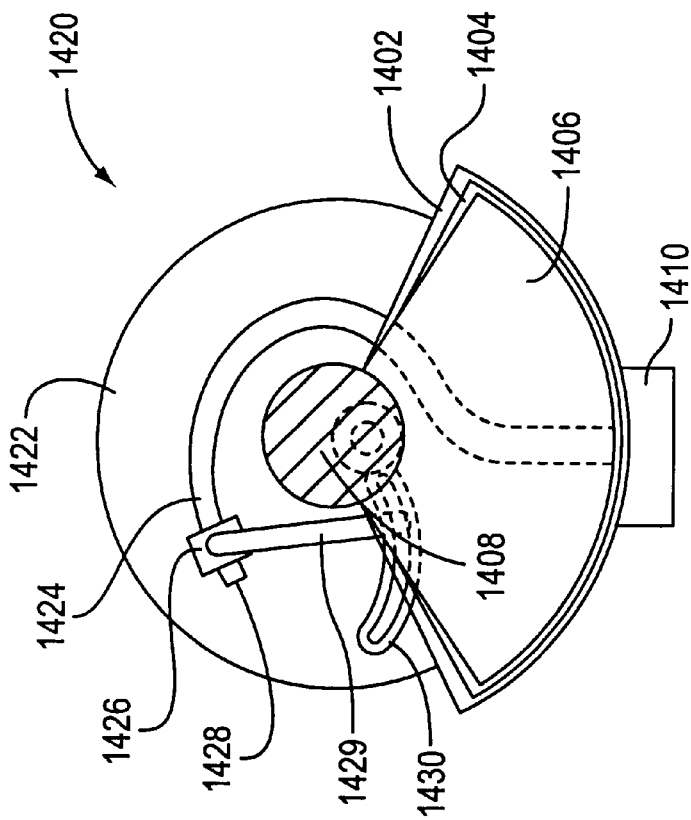
FIGS. 14A and 14B illustrate a side view of a thermally isolating shield of the invention which moves between open and closed configurations.
Figure 14A:
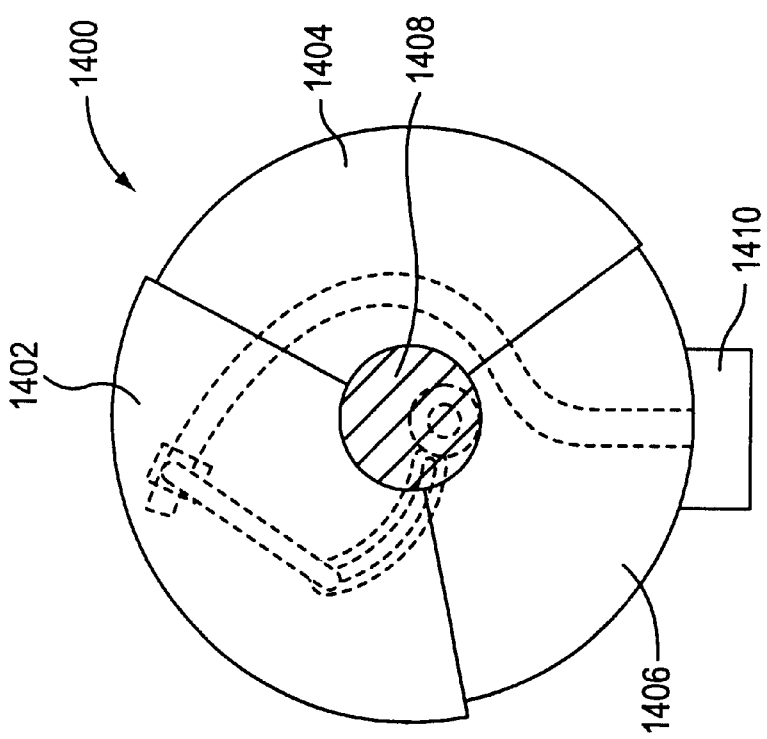

A second shield embodiment including a moveable shield is illustrated in FIGS. 14A and 14B. Such a moveable shield minimizes conductance loss by allowing substantially all of the getter elements to be exposed to the chamber atmosphere simultaneously, and yet can isolate the getter elements as desired for regeneration, system maintenance, during bake-out, etc. As illustrated in FIG. 14A of 1400, a moveable shield embodiment wherein the shield is in a closed position, ie., all of the shield elements 1402, 1404 and 1406 are covering the getter elements, is described. The shield elements rotate about hub 1408 which hub is supported by support 1410. The movable shield elements are, again, preferably made from stainless steel.

Figure 15:
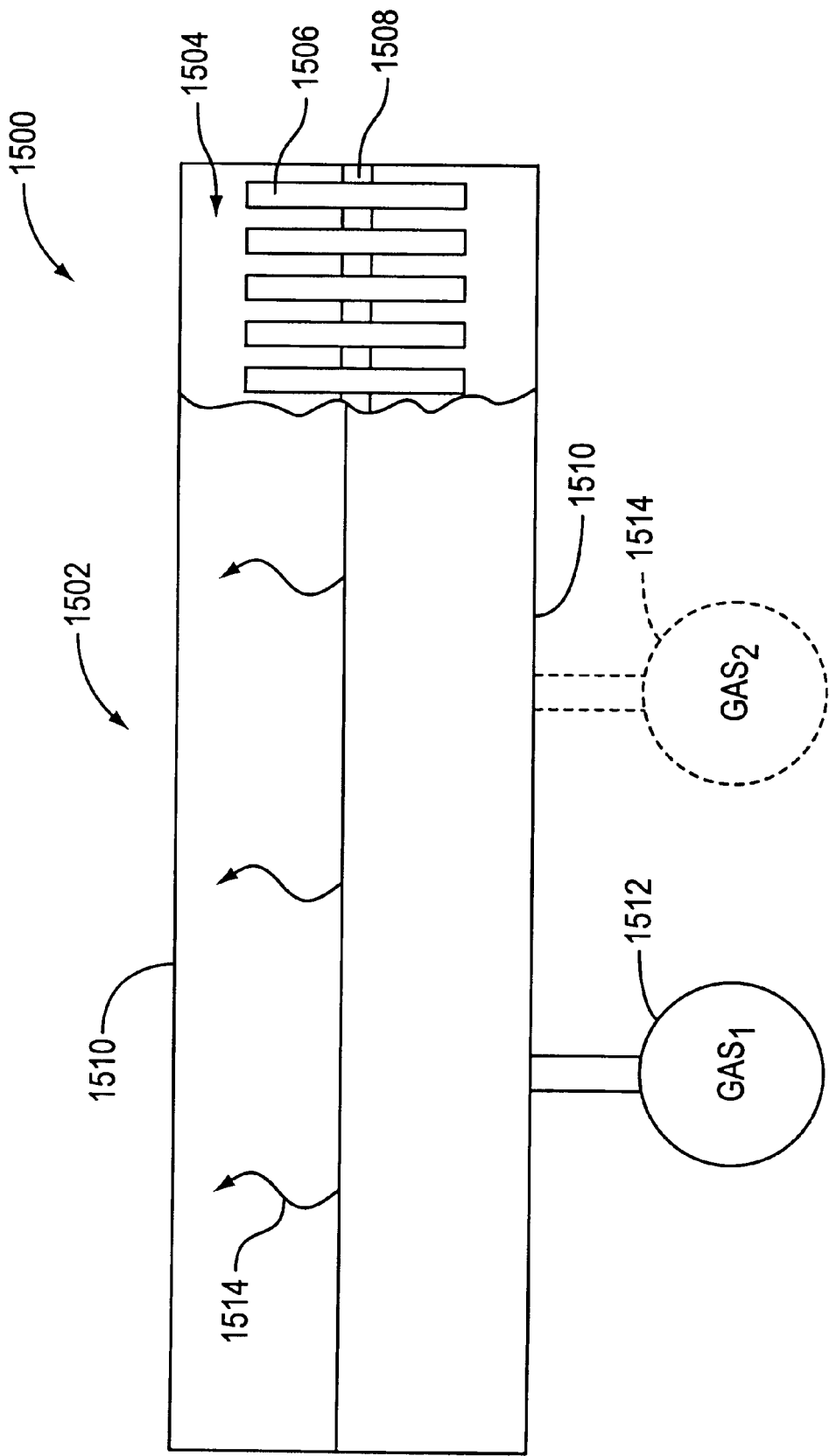
FIG. 15 is a partial cut-away view of the embodiments shown in FIGS. 14A and 14B, further showing gas sources.

FIG. 14B illustrates an open position of the shield at 1420 in which getter element 1422 is exposed substantially to the chamber atmosphere. The mechanism for opening and closing the shield is also illustrated. In a preferred embodiment, the mechanism for opening and closing the shield comprises a flexible tube 1424 which tube includes a ring 1426 coupled to a one way valve 1428. The ring is further pivotably coupled to the proximal end of a rod 1429, which rod is slideably coupled to the grooved extension of a gear 1430 which extension slideably receives the distal end of the rod. The geared portion of gear 1430 is engaged with a smaller gear (not shown) which smaller gear is coupled to the shields 1402, 1404 and 1406. When the tube is charged with gas and straightens, the rising of collar 1426 causes a rotation of gear 1430 which in turn initiates a larger rotation in the smaller gear thereby creating a rotation of the shields about hub 1408 to a closed position. Conversely, when the tube is discharged and assumes its deflated position, the lowering of ring 1426 causes a rotation of the gears in the reverse direction, opening the shields. In this fashion, the shielded getter pump can be opened and closed remotely. However, it will be appreciated that various mechanical, electrical, hydraulic and/or pneumatic mechanisms can be adapted to achieve the same result Another view of the embodiment just described is illustrated in FIG. 15 at 1500 which shows the shielded getter pump 1502 and the getter elements 1506 and heating element 1508 in a partial cut away at 1504. The shield elements are shown at 1510 and 1512. A gas supply for operating the mechanism for opening, and closing the shield is shown at 1512. A second, optional, gas supply (preferably nitrogen) for providing a positive pressure relative to the chamber's atmospheric pressure of a gas is also shown at 1514. Preferably, the gasses supplied to the getter pump are inert gasses or nitrogen. In this fashion, the movable shield can be closed and a nitrogen purge will isolate the getter elements from the ambient environment. Nitrogen is also a preferred gas for providing a "passivating layer" over the getter element surfaces to protect the getter elements from more harmful gasses, such as oxygen, as the nitrogen layer can be readily removed from the elements by heating (i.e., regeneration). This is particularly useful during system maintenance or repair where the chamber is open to the atmosphere, since protecting the getter elements will enhance their useful life spans.

Figure 16:
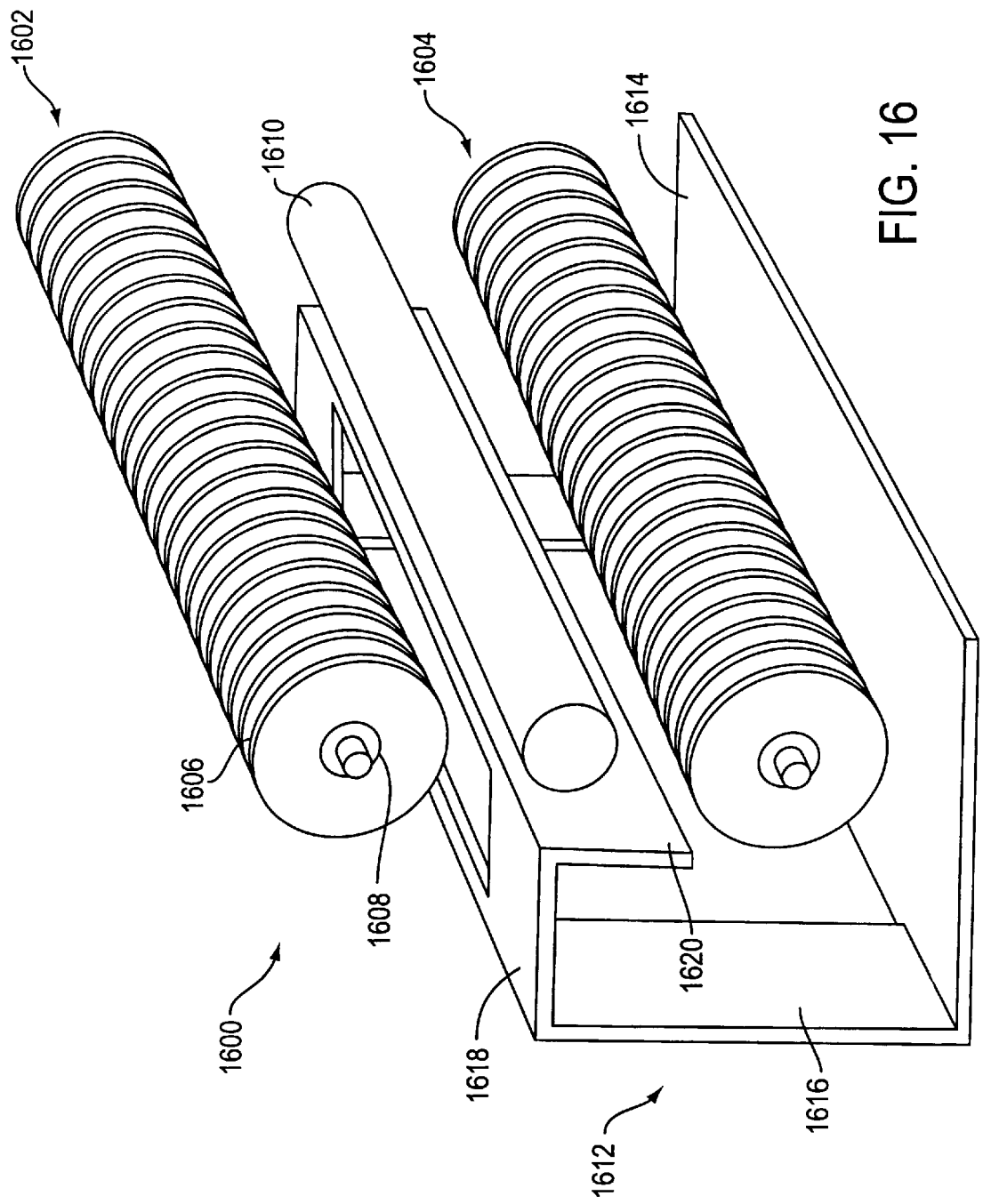
FIG. 16 is an illustration of a getter pump that includes a focus shield.

Still another embodiment is illustrated at 1600 in FIG. 16. There, getter assemblies 1602 and 1604, comprising a plurality of getter disks 1606, each including a hub such as that shown at 1608, are arranged above and below a proximate heater element 1610. The getter assemblies, their constituent getter disks and the heater element are substantially as described with respect to FIG. 2 above. The supports for getter assemblies 1602 and 1604, and heater element 1610, are not shown.

Next to the getter assemblies and heater element is a focus shield unit 1612 which comprises support elements 1614, 1616, and 1618 that together support a focus shield 1620. The focus shield unit is formed from the same materials described above with respect to thermally isolating shield 214. Focus shield 1620 comprises a thermally reflective surface that is arranged adjacent heater element 1610 and is dimensioned to reflect the heat emitted by the heater element onto the getter disks of the getter assemblies 1602 and 1604. In one embodiment, the focus shield unit comprises a stainless steel material, such as "316 Stainless Steel". The focus shield may also be plated with a highly reflective material (e.g., nickel) and/or electropolished to about 25 RA.

The focus shield can be a substantially planar, rectangular surface or it can be formed into any configuration that increases the efficiency of heat transfer from the heater element to the getter disks. For example, the focus shield can be partially or wholly convex, or faceted, with the convex side of the focus shield directed towards the heater element and getter disks to enhance the heating of the getter material for activation. By "substantially planar" it is meant that the surface is essentially planar, although some degree of variance from perfect planarity is acceptable. It will be appreciated from the foregoing discussion regarding conductance and exposure that the embodiment shown in FIG. 16 has the advantage of providing high conductance—as much as 80% or 90%—due to the relatively open construction of the focus shield unit; yet, the arrangement of the focus shield near the heater element and the getter disks pros ides sufficient transfer of heat energy to the disks to allow efficient activation of the getter material.

In addition to the particular embodiment shown in FIG. 16, other embodiments employing the focus shield unit shown in FIG. 16 are included in the present invention. In one embodiment, the getter assemblies and heater element are positioned between two focus shield units in a substantially symmetric fashion to increase the amount of heat energy reflected to the getter material. This "symmetric" embodiment can be extended to produce "banks" of getters pumps in which focus shield units are arranged in a back-to-back fashion with the getter assemblies and heater elements being arranged between opposing focus shield faces. Alternatively, several getter assemblies and heater elements can be stacked in alternating order with stacked focus shields being deployed substantially opposite the heater elements. Such an embodiment can be useful where horizontal space is limited, but vertical space is available. Still more useful arrangements will be apparent to those having skill in the art.

Figure 17:
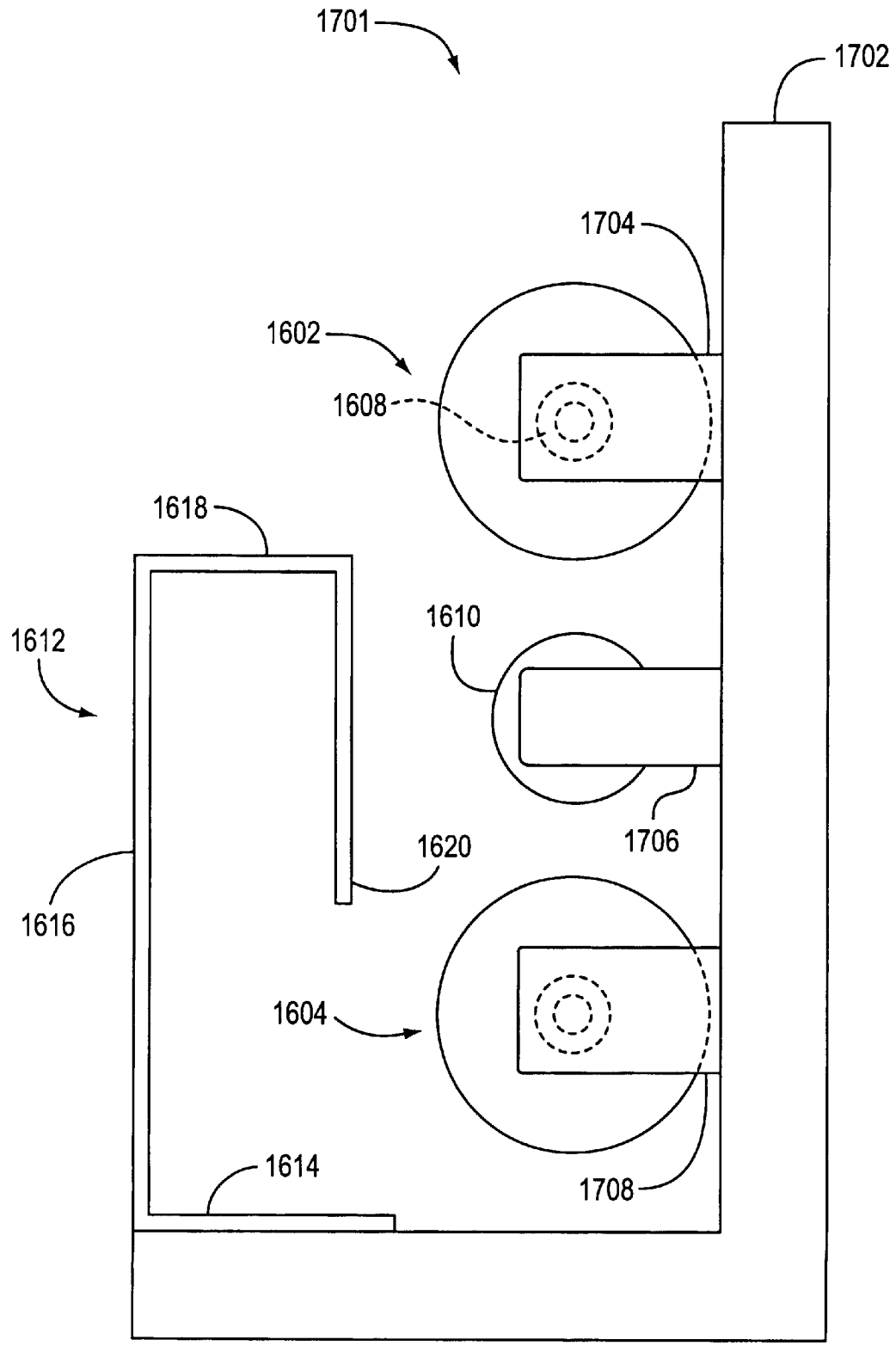
FIG. 17 is a cut-away view of the embodiment illustrated in FIG. 16, further including an L-shaped thermally isolating shield.

The focus shield unit of the present invention can also be employed advantageously in embodiments in which the getter assemblies and heater element require greater exposure to the atmosphere of the processing chamber than available using thermally isolating shield other than that shown in FIG. 2 at 214 (and, hence, provide higher pumping speeds). One such embodiment is illustrated in FIG. 17 at 1700. There, a substantially "L-shaped" shield 1701, comprising a thermally isolating wall 1702 and a thermally isolating floor 1703, is provided from which getter assemblies 1602 and 1604, and heater element 1610, are suspended by supports 1704, 1706, and 1708, respectively. Focus shield unit 1612 is arranged such that the reflective surface of focus shield 1620 is substantially opposite heater element 1610, thereby reflecting heat energy emitted by the heater element to the getter material of the getter assemblies 1602 and 1604. However, the wall of the L-shield 1702 prevents substantial heat transfer to the remainder of the processing chamber and can serve as a reflector to reflect heat energy emitted from the heater element to the sides of the getter assemblies facing away from the focus shield 1620. In one embodiment, the interior surface of wall 1702 (i.e., the surface of the wall facing the heater element and getter assemblies) has substantially the same reflectivity as the focus shield.

Other similar embodiments to that shown in FIG. 17 will be apparent to those of skill in the art. For example, the floor of the L-shield 1703 can be omitted so that only wall 1702 is present. Also, the getter assemblies and/or heater element can be supported by means other than suspension from wall 1702. In one possible embodiment, focus shield 1620 can be supported from a second thermally isolating wall substantially identical to, and opposing, wall 1702 to form a "U-shaped" shield. In still another alternate embodiment, thermally isolating wall 1702 is employed without focus shield unit 1612 to prevent substantial heating of the processing chamber outside of the getter pump by heater element 1610. In yet another alternate embodiment, heater element 1610 comprises a reflective coating to direct thermal radiation from the heater element to the getter material. Such a heater element can be employed in embodiments that lack the above-described focus shield as the reflective character of the lamps can provide direction of thermal energy from the heater element to the getter material.

Figure 18:
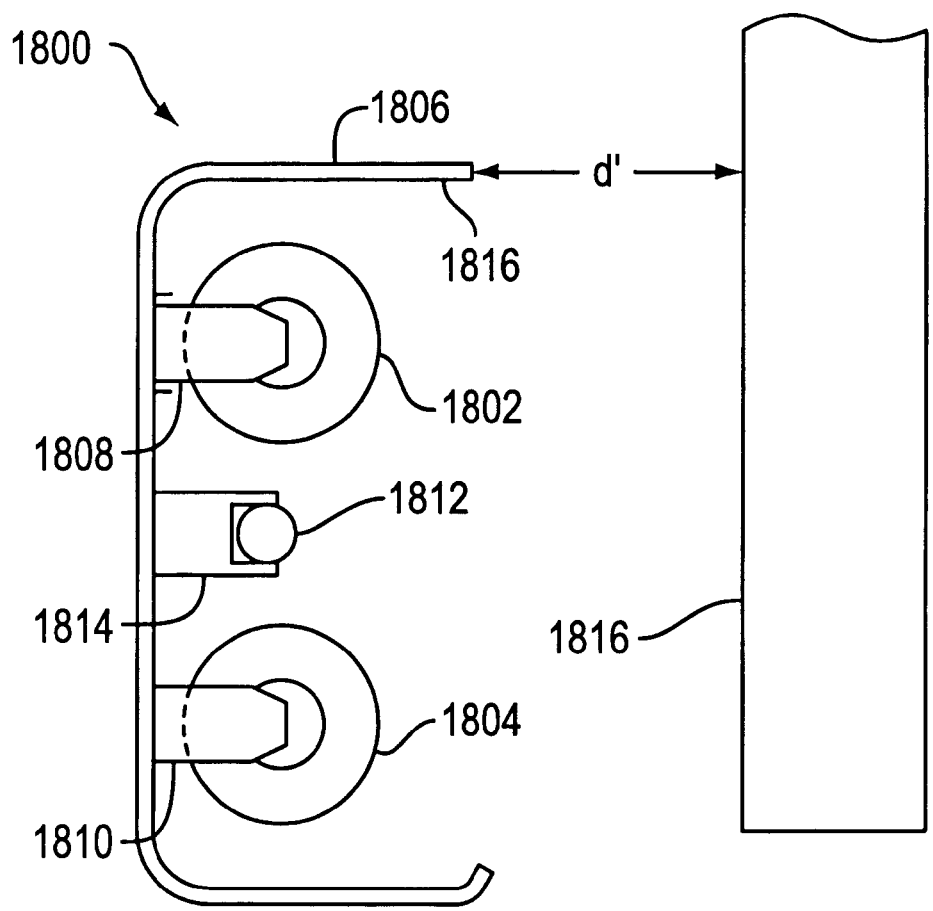
FIG. 18 is an illustration of one embodiment of the getter pump of the invention.

One particular alternate embodiment is illustrated in FIG. 18 at 1800. There, a getter pump configuration similar to that illustrated in FIG. 17 is shown; but in which getter modules 1802 and 1804 are supported by thermal shield 1806 using supports 1808 and 1810 respectively. A heating element 1812 is arranged substantially between the getter modules 1802 and 1804 using support 1814. Adjacent the getter pump, at a distance d', is the wall of the processing chamber 1816. The elements are arranged such that reflective interior surface 1818 provides substantial reflection of heat energy from heating element 1812 to getter modules 1802 and 1804, while substantially thermally protecting the getter material from other heat sources in the processing chamber. In practice, this embodiment has demonstrated desirable pumping speeds while providing good thermal insulating properties to protect both the getter material and other components in the processing chamber. It will be appreciated that the pumping characteristics of the getter pump shown at 1800 can be controlled in part by adjusting the distance d' between shield 1806 and wall 1816.

Figure 19:
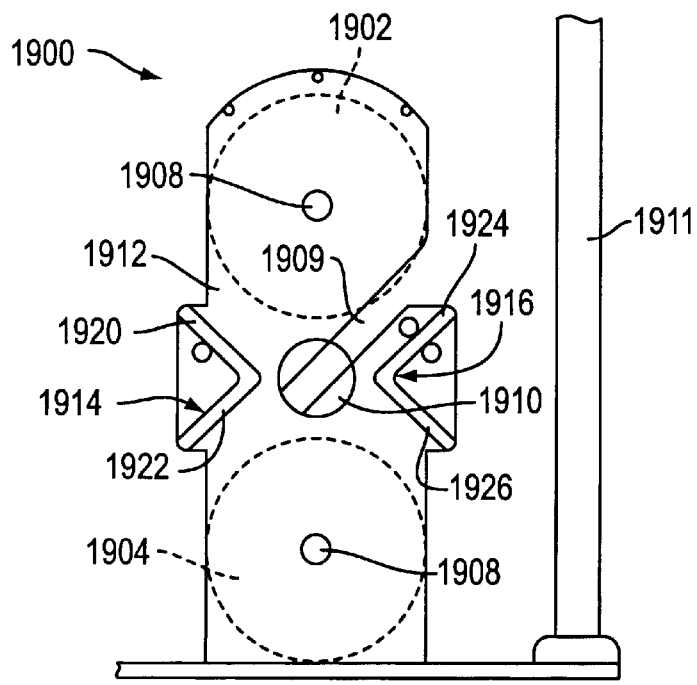
FIG. 19 is a side view of an embodiment of the getter pump of the present invention that includes two angled focus shields.

A side elevational view of an alternate embodiment of a getter pump including a focus shield of the present invention is illustrated in FIG. 19 at 1900. Pump 1900 is suitable for use in a lower temperature sputtering process in which the getter materials need not be shielded from process heat sources such as lamps 112 and 112' as shown in FIG. 1. For example, a chamber similar to chamber 100 of FIG. 1 can be provided with heating elements in platform 108 providing the heat (e.g. about 25–200° C.) to implement low temperature sputtering. The heater element of the getter pump 1900 (described below) can be used both to activate the getter materials of the pump and to bake out the processing chamber to remove unwanted chemicals and materials in the chamber, as is well known to those skilled in the art. For example, a combined bake-out/activation phase can be performed using the heater element of pump 1900, followed by one or more conditioning or sputtering processes in which a material is deposited on a wafer. During a low temperature sputtering process, heat is generated (at least indirectly) by the plasma used in the sputtering process and/or another heat source, such as a heating element in platform 108.

Similar to the embodiment 1600 shown in FIG. 16, pump 1900 includes getter assemblies 1902 and 1904 which each comprise multiple getter disks arranged on a hub 1908. Getter assemblies 1902 and 1904 are arranged above and below a heater element 1910. The getter assemblies, their constituent getter disks and the heater element are substantially as described with respect to FIGS. 2 and 16 above. For example, the getter elements can be made of St 172 or St 182 as described above. Support 1912 is provided at both ends of the getter assemblies and heater element (one support is shown in FIG. 19) for supporting the getter assemblies, heater, and other elements of the getter pump 1900. For example, slot 1909 can be provided in the supports 1912 to receive and support fitted ends of the heater element 1910. Alternatively, slot 1909 can be provided in one support 1912 with a fitted hole provided in the other support 1912 to receive an end of heater element 1910. A chamber wall 1911 is typically positioned near the getter pump 1900. Alternatively, the pump can be positioned in other areas of the chamber further away from wall 1911. A thermocouple (not shown) is also preferably coupled to support 1912 (and a safety lock can be provided external to the chamber) for protection from venting the chamber when the temperature falls below a particular threshold, as is well known to those skilled in the art.

A focus shield 1914 and a focus shield 1916 are provided proximate to the heater element 1910 and the getter assemblies 1902 and 1904. Focus shield 1914 is supported, at least in part, by support 1912 and is positioned on one side of heater element 1910, while focus shield 1916 is also supported at least in part by support 1912 and is positioned on the other side of heater element 1910. Shields 1914 and 1916 preferably extend parallel to the getter assemblies 1902 and 1904 along substantially the entire length of the assemblies. Focus shields 1914 and 1916 are preferably formed of the same materials described above with respect to the focus shield 1620 of FIG. 16, including a thermally reflective surface dimensioned to reflect heat emitted by the heater element onto the getter disks of the getter assemblies 1902 and 1904. For example, the focus shield unit may comprise stainless steel material such as "316 Stainless Steel" and/or may be plated with a highly reflective material and/or electropolished to about 25 RA.

The focus shields of embodiment 1900 are angled, wedge-shaped shields whose shape are advantageous in directing heat from heater element 1910 toward the getter disks of the getter assemblies 1902 and 1904. For example, portion 1920 of shield 1914 and portion 1924 of shield 1916 reflect heat from the heater element 1910 toward getter assembly 1902, while side 1922 of shield 1914 and side 1926 of shield 1916 reflect heat from the heater element 1910 toward getter assembly 1904. This allows the temperature of the getter assemblies 1902 and 1904 to be increased more quickly during the activation phase of the getter materials and allows a greater maximum temperature of the getter materials, which in turn allows a shorter activation time, thereby increasing the efficiency of the getter pump and allowing more pumping of gasses to be accomplished in a particular period of time. For example, the getter assemblies of pump 1900 are able to reach an activation temperature (maximum temperature which is reached by the getter assemblies during activation) of more than 550 degrees C, which is at least 25 degrees greater than the activation temperature achieved with other types of getter pumps (such as the pump 1800 of FIG. 18), assuming the same input power to the heating elements.

In addition, the wedge-shaped shields of embodiment 1900 reduce the thermal flux seen by chamber wall 1911 during the baking of the getter assemblies. This indirectly reduces the thermal flux seen by the thermal protection system of the processing chamber, since the thermal protection system monitors the chamber wall temperature and removes power from active heaters in the chamber when the chamber wall temperature rises above a predetermined threshold. Thus, a reduction of thermal flux seen by the chamber wall allows an extension of the time at which the getter assemblies are at the maximum temperature (which is the "activation time" of the getter pump 1900, and/or "regeneration time" after the getter elements have been exposed to air and passivated before having to shut down the heating element 1910 for system and operator safety). The most efficient pumping of a getter pump typically occurs in this activation period before the first thermal shut down by the protection system. For example, the activation time of getter pump 1900 can be extended incrementally longer (e.g., about 15 minutes) than other types of pumps before the thermal protection system causes the temperature to drop. With an extended activation time, the efficiency of the activation pumping process is increased, more of the getter material becomes active, and pumping speeds can be improved.

Furthermore, the pump 1900 is more open to the atmosphere of the processing chamber than other pumps such as those described with reference to FIGS. 16, 17, and especially 18, since preferably no strong heat sources are used in the chamber with pump 1900. The open design allows a greater conductance and thus increases the pumping speed of the getter assemblies.

In another embodiment, a single shield 1214 or 1216 can be provided instead of the two shields shown in FIG. 19. In addition, as described above with reference to FIG. 16, the getter pump 1900 can be extended to produce "banks" of getter pumps in which focus shield units are arranged in a back-to-back fashion with the getter assemblies and heater elements being arranged between opposing focus shield faces. Alternatively, several getter assemblies and heater elements can be stacked in alternating order with stacked focus shields being deployed substantially opposite the heater elements. Such an embodiment can be useful where horizontal space is limited, but vertical space is available.

In yet other embodiments, the focus shields (of all the embodiments described herein) can take other shapes, e.g., curved surfaces such as parabolas, semicircles, convex shapes, confocal shapes, etc. For example, a curved focus shield can have curved portions approximately in the same orientations as the planar portions of the focus shields depicted in FIG. 19. e.g. a parabola having ends curving away from heater element 2110. Curved surfaces can also be provided in place of angles and planar surfaces in the embodiments below having extended portions to the focus shields.

Figure 20:
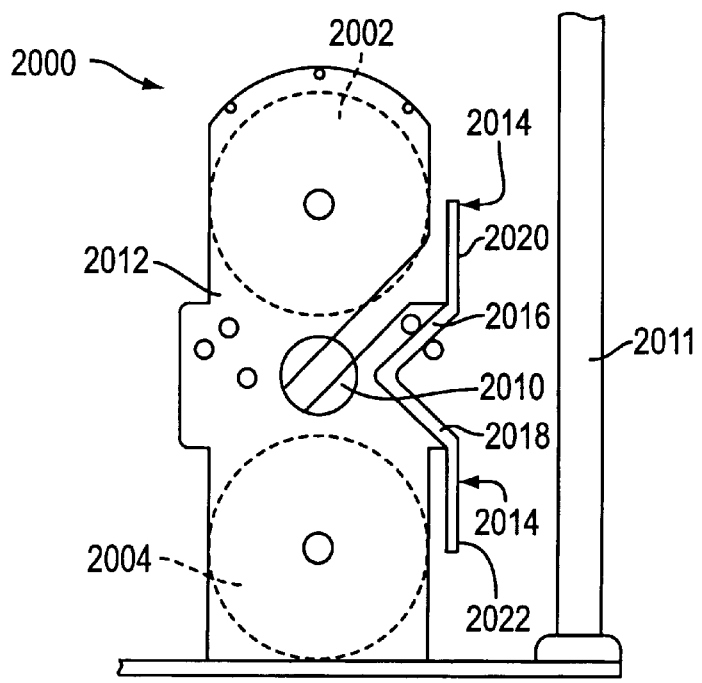
FIG. 20 is a side view of an embodiment of the getter pump of FIG. 19 having one angled shield with planar extension portions.

FIG. 20 illustrates an alternate embodiment 2000 of the getter pump 1900 of FIG. 19. Pump 2000 includes getter assemblies 2002 and 2004 which each comprise multiple getter disks substantially similar to those of pumps 1600 and 1900, as well as a heater element 2010 and support 2012.

A focus shield 2014 is also included on one side of pump 2000 between heater element 2010 and chamber wall 2011, and which includes a thermally reflective surface similar to shield 1916. Shield 2014 includes wedge-shaped wall portions 2016 and 2018 similar to the focus shields 1914 and 1916 of pump 1900. In addition, shield 2014 includes extended portions 2020 and 2022, which serve to reflect additional heat onto getter assemblies 2002 and 2004 and, more importantly, reduce the amount of direct radiation from heater element 2010 seen by chamber wall 2011. As for pump 1900, by reducing the thermal flux seen by the chamber wall, the activation time before the shutdown of the heater element can be extended. Compared with the getter pump 1900, the shield 2014 allows longer activation times at higher activation temperatures due to the extended portions 2020 and 2022. For example, an activation temperature for pump 2000 can be about 550° C. compared to about 590° C. for pump 1900, assuming the same power input to the heating elements in each case. Pump 2000 may have to be run longer than pump 1900 to achieve the same activation percentage of getter material.

In one alternate embodiment, substantially the entire length of extended portion 2022, or a portion thereof, is removed. Since heat reflecting off of wall 1911 and the floor of the chamber tends to heat up the bottom getter assembly 2004 to a greater temperature than top getter assembly 2002, there is typically a temperature difference between the getter assemblies in the activation and bake-out phase of operation. It is often more desireable to keep the getter assemblies 2002 and 2004 as close as possible in temperature to provide more efficient getter pumping. Removal of extended portion 2022 causes less heat to be reflected onto bottom getter assembly 2004, and thus the bottom getter assembly 2004 has a temperature closer to the top getter assembly 2002.

Figure 21:
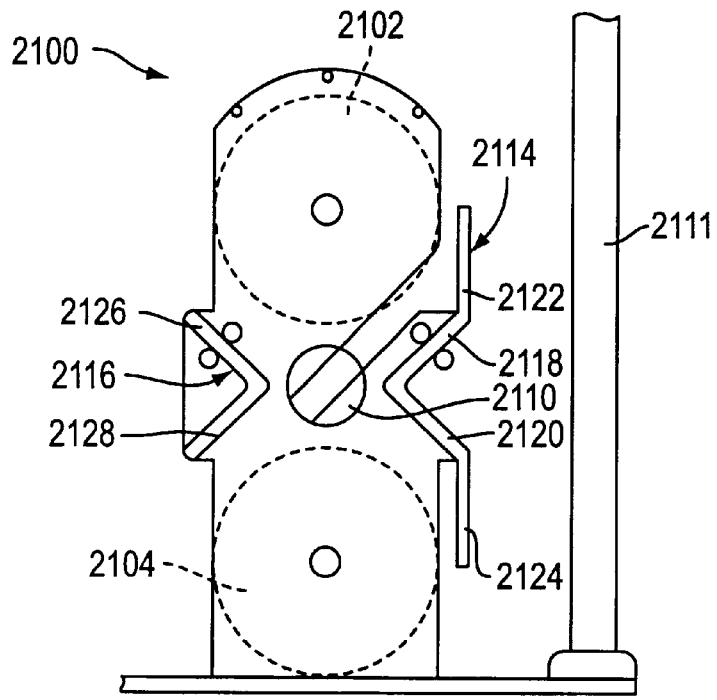
FIG. 21 is a side view of an embodiment of the getter pump of FIG. 19 having an angled focus shield with planar extension portions and a second angled focus shield.

FIG. 21 illustrates another alternate embodiment 2100 of the getter pump 1900 of FIG. 19. Pump 2100 includes getter assemblies 2102 and 2104, heater element 2110, and support 2112 substantially similar to those elements of getter pumps 1900 and 2000. Pump 2100 also includes focus shields 2114 and 2116. Shield 2114 is substantially similar to focus shield 2014 of FIG. 20, aid includes wedge-shaped portions 2118 and 2120, as well as extended portions 2122 and 2124. Shield 2116 is substantially similar to focus shield 1914 of FIG. 19, and includes wedge-shaped wall portions 2126 and 2128. Shields 2114 and 2116 function substantially similarly to these shields in the above-described pumps 1900 and 2000.

The combination of shields 2114 and 2116 on a single getter pump 2100 allows better results to be achieved. Shield 2114 reflects heat onto getter assemblies 2102 and 2104 and reduces the amount of direct radiation from getter element 2110 seen by chamber wall 2111, thus extending the activation time of the getter pump 2100. Shield 2116 also reflects a greater amount of heat onto the getter assemblies 2102 and 2104. Pump 2100 thus can achieve higher ultimate temperatures that the pumps 1900 and 2000, for example, at least 40–65 degrees C higher. Furthermore, other benefits are also realized using the configuration of pump 2100. For example, reducing the power to heater element 2110 has a much more limited effect in reducing the getter material temperature when using pump 2100 compared to the embodiments 1900 and 2000. For instance, in one test, a reduction of power by 5% only lowered getter temperature by 15 degrees C. Such a feature allows a single power setting to be used for the getter pump that is able to increase activation % of material that occurs in same amt of time, with no power increase required.

In one alternate preferred embodiment, substantially the entire length of extended portion 2124, or a portion thereof, is removed. Since heat reflecting off of wall 2111 and the floor of the chamber tends to heat up the bottom getter assembly 2104 to a greater temperature than top getter assembly 2102, there is typically a temperature difference between the getter assemblies in the activation and bake-out phase of operation. It is often more desireable to keep the getter assemblies 2102 and 2104 as close as possible in temperature to provide more efficient getter pumping. Removal of extended portion 2124 causes less heat to be reflected onto bottom getter assembly 2104, and thus the bottom getter assembly 2104 has a temperature closer to the top getter assembly 2102.

Figure 22:
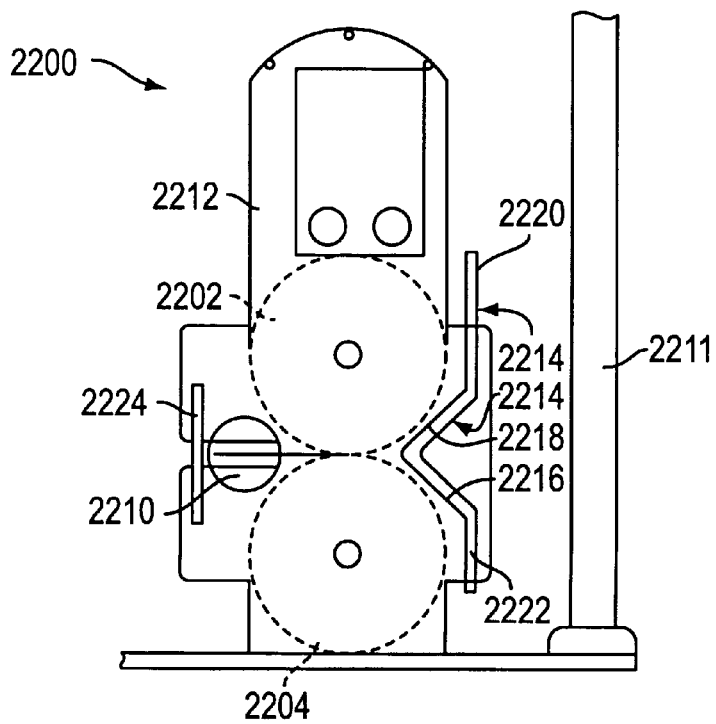
FIG. 22 is a side view of an alternate embodiment of the getter pump of FIG. 19 including two focus shields and a heater element positioned to one side of the pump.

In addition, in an alternate embodiment, better uniformity of temperatures between top getter assembly 2102 and bottom getter assembly 2104 can be achieved with pump 2100 than with pump 1900 by removing all or part of extended portion 2122 of the shield 2114, as explained above for pump 2000. For example, in one test, a difference of 10 degrees C was found between the two getter assemblies, compared with a difference of 40 degrees C in the pump 1900 which is typically less efficient FIG. 22 illustrates a different embodiment of a getter pump 2200. Pump 2200 includes a getter assembly 2202 and a getter assembly 2204 which are positioned closer to each other than the above getter pump embodiments of FIGS. 19–21. A heater element 2210 is positioned to one side of the getter assemblies 2202 and 2204 to allow better baking of the process chamber, i.e., the heater element is better able to transmit heat to the chamber as well as to the getter assemblies in a combined activation/bake-out stage of operation. A focus shield 2214 is provided on one side of the getter assemblies 2202 and 2204 in front of the chamber wall 2211, where the shield includes wedge wall portions 2216 and 2218 as well as extended portions 2220 and 2222. Extended portion 2222 can be shorter than extended portion 2220, or can be removed entirely in other embodiments as described above. Focus shield 2214 functions similarly to the shields 2114 and 2014 described above. Getter pump 2200 also includes a shield 2224 supported by support 2212 on one side of the heating element 2210 such that the heating element 2210 is positioned between the getter assemblies and the shield 2224. Shield 2224 reflects heat from the heating element back to the getter assemblies 2202 and 2204 and reduces the thermal flux seen by walls of the processing chamber. Shield 2224 is preferably provided as a planar, flat plate as shown, but may be provided in other shapes in other embodiments, such as any configuration that increases the efficiency of heat transfer from the heater element to the getter disks. For example, the focus shield can be partially or wholly convex, or faceted, with the convex side of the focus shield directed towards the heater element and getter disks to enhance the heating of the getter material for activation.

Getter pump 2200 has certain advantages over previously-described getter pump embodiments. For example, the heating element 2210 is positioned further away from the enclosed area of the getter assemblies and is thus able to heat the process chamber to a greater degree than the other types of pumps. In addition, getter pump 2200 may in some embodiments allow better pumping performance for the getter pump due to improved conductances around the top getter assembly 2202. Furthermore, pump 2200 typically does not heat the chamber walls to as high a temperature a the other types of getter pumps, thus allowing a greater activation time due to the heater element 2210 being provided a further distance from the chamber wall (although there is also an increased heat sink (getter) between the heating element and the wall as well as a comb filtering effect created by the getter disks themselves, since the disks occlude approximately 50% of the viewing angle to the wall). For example, in one test, a simulated chamber wall only reached 330° C. for pump 2200, compared to 372° C. for pump 2100 and 410° C. for pump 1900. In addition, in some cases, pump 2200 may be easier to assemble from a manufacturing standpoint, e.g. the heater element need not be assembled in place after the bottom getter assembly and before the top getter assembly.

Thus, it will be seen that the present invention addresses substantially the need to provide an apparatus and method for creating high-vacuum conditions. Using the method and apparatus of the invention as described herein, high-vacuum states, such as desired in semiconductor processing chambers, can be created more efficiently and effectively than heretofore possible.

Although the invention has been described with reference to certain examples and embodiments, it will be appreciated by those of skill in the art that alternative embodiments can be made which do not depart from the scope or spirit of the invention. It is therefore intended that the following appended claims be interpreted in light of the true spirit and scope of the present invention.

What is claimed is:

1. An in-situ getter pump comprising:
    a plurality of solid porous getter elements of sintered getter material, each of said getter elements having an aperture extending therethrough, wherein said plurality of getter elements are included in a first getter assembly;
    a second getter assembly including a plurality of getter elements;
    a means for heating said getter material disposed proximate to said getter material;
    a first focus shield proximate to said getter elements and partially surrounding said getter elements, said first focus shield being positioned between said getter elements and a wall of a chamber that encloses said getter elements, said means for heating, and said first focus shield; and
    a second focus shield positioned on the other side of said means for heating from said first focus shield, wherein said first focus shield and said second focus shield each include a wedge-shaped portion having two wall portions coupled together, said wall portions oriented approximately toward said means for heating.

2. An in-situ getter pump comprising:
    a plurality of solid porous getter elements of sintered getter material, each of said getter elements having an aperture extending therethrough, wherein said plurality of getter elements are included in a first getter assembly;
    a second getter assembly including a plurality of getter elements;

a means for heating said getter material disposed proximate to said getter material;

a first focus shield proximate to said letter elements and partially surrounding said getter elements, said first focus shield being positioned between said getter elements and a wall of a chamber that encloses said getter elements, said means for heating, and said first focus shield; and a second focus shield positioned on the other side of said means for heating from said first focus shield, wherein said first focus shield includes a wedge-shaped portion having two wall portions angled approximately toward said means for heating, and wherein said second focus shield is substantially planar.

3. A getter pump as recited in claim 2 wherein said first getter assembly is positioned over said second getter assembly such that no substantial space is provided between said first getter assembly and said second getter assembly, and wherein said means for heating is provided on one side of said getter assemblies between said second focus shield and said getter assemblies.

4. An in-situ getter pump, comprising:

a plurality of solid porous getter elements of porous, sintered getter material;

a heater proximate to said getter elements for heating said getter material; and a plurality of focus shields, said heater being proximate to said plurality of focus shields, said focus shields reflecting thermal energy emitted by said heater onto said getter material, said getter pump being adapted to be disposed within a chamber proximate to a wall of said chamber.

5. A getter pump as recited in claim 4 wherein said plurality of getter elements are included in a first getter assembly, and further comprising a second getter assembly include a plurality of solid porous getter elements of porous, sintered getter material.

6. A getter pump as recited in claim 5 wherein said heater is positioned between said first getter assembly and said second getter assembly.

7. A getter pump as recited in claim 6 wherein said plurality of focus shields each include a wedge-shaped portion having two wall portions angled approximately toward said heater element and operative to reflect heat onto said getter assemblies.

8. A getter pump as recited in claim 6 wherein said plurality of focus shields each include a curved portion approximately in a parabolic shape having ends curving away from said heater element and operative to reflect heat onto said getter assemblies.

9. A getter pump as recited in claim 7 wherein a first one of said focus shields is positioned between said heater element and said wall of said chamber, wherein said first focus shield includes substantially planar extended portions extending from said angled wall portions.

10. A getter pump as recited in claim 5 wherein said heater is positioned to one side of said first getter assembly and said second getter assembly.

11. A getter pump as recited in claim 10 wherein a first one of said focus shields includes two wall portions oriented toward said heater element and operative to reflect heat onto said getter assemblies, and wherein a second one of said focus shields is positioned such that said heater is positioned between said second focus shield and said getter assemblies.

12. A getter pump as recited in claim 11 wherein said first focus shield includes at least one substantially planar extended portion extending from said angled wall portion, and wherein said second focus shield is substantially planar.

13. An in-situ getter pump comprising:

a first getter assembly and a second getter assembly, both including a plurality of getter elements, each of said getter elements having an aperture extending therethrough;

a means for heating said getter elements disposed between said first getter assembly and said second getter assembly; and a focus shield proximate to said getter elements and partially surrounding said getter elements, said focus shield being positioned between said getter elements and a wall of a chamber that encloses said getter elements, said means for heating, and said focus shield.

14. A getter pump as recited in claim 13 wherein said focus shield includes a wedge-shaped portion having two wall portions angled in a direction toward said heater element.

15. A getter pump as recited in claim 14 wherein said focus shield includes a substantially planar extended portion coupled to each end of said wedge portion.

16. A getter pump as recited in claim 13 wherein said focus shield includes a curved portion approximately in a parabolic shape having ends curving approximately away from said heater element and operative to reflect heat onto said getter elements.

17. A getter pump as recited in claim 13 wherein said focus shield is a first focus shield, and further comprising a second focus shield positioned on the other side of said means for heating from said first focus shield.

18. A getter pump as recited in claim 17 wherein said first focus shield and said second focus shield each include a wedge-shaped portion having two wall portions coupled together, said wall portions oriented approximately toward said heater element.

19. A getter pump as recited in claim 17 wherein said first focus shield includes a wedge-shaped portion having two wall portions angled approximately toward said heater element, and wherein said second focus shield is substantially planar.

20. A getter pump as recited in claim 19 wherein said first getter assembly is positioned over said second getter assembly such that no substantial space is provided between said first getter assembly and said second getter assembly, and wherein said means for heating is provided on one side of said getter assemblies between said second focus shield and said getter assemblies.

21. A getter pump comprising:

at least one getter assembly including a plurality of getter elements supported by a support;

a radiant heater proximate to said at least one getter assembly and supported by a support;

a thermally isolating focus shield having a thermally reflective inner surface, said shield, wherein said focus shield includes a wedge-shaped portion having two wall portions angled toward said heater element and operative to reflect heat onto said getter assembly; and a semiconductor processing chamber enclosing said getter elements, said focus shield, and said radiant heater such that said getter elements are near to a wall of said chamber and said focus shield is positioned between said getter elements and said processing chamber.

22. The getter pump of claim 21 wherein said plurality of getter elements are included in a first getter assembly, and further comprising a second getter assembly include a plurality of solid porous getter elements of porous, sintered getter material.

23. The getter pump of claim 21 wherein said focus shield includes substantially planar extended portions extending from said angled wall portions.

24. The getter pump of claim 23 wherein said focus shield is a first focus shield positioned between said heater element and said wall of said chamber and includes a wedge-shaped portion having two wall portions angled toward said heater element and operative to reflect heat onto said getter assemblies, and further comprising a second focus shield provided on a different side of said heater.

25. The getter pump of claim 24 wherein said radiant heater is supported between said two getter assemblies, and wherein said first focus shield includes substantially planar extended portions extending from said angled wall portions.

26. The getter pump of claim 24 wherein said heater is positioned to one side of said first getter assembly and said second getter assembly, and wherein said second focus shield is substantially planar.

27. The getter pump of claim 21 wherein a temperature of said getter elements during activation is greater than about 550° C.

* * * * *